(12) United States Patent
Kumar et al.

(10) Patent No.: US 9,540,233 B2
(45) Date of Patent: *Jan. 10, 2017

(54) METHODS OF FORMING THREE-DIMENSIONAL STRUCTURES HAVING REDUCED STRESS AND/OR CURVATURE

(71) Applicant: Microfabrica Inc., Van Nuys (CA)

(72) Inventors: Ananda H. Kumar, Fremont, CA (US); Jorge S. Albarran, Santa Clarita, CA (US); Adam L. Cohen, Dallas, TX (US); Kieun Kim, Pasadena, CA (US); Michael S. Lockard, Lake Elizabeth, CA (US); Uri Frodis, Los Angeles, CA (US); Dennis R. Smalley, Newhall, CA (US)

(73) Assignee: Microfabrica Inc., Van Nuys, CA (US)

( * ) Notice: Subject to any disclaimer, the term of this patent is extended or adjusted under 35 U.S.C. 154(b) by 181 days.

This patent is subject to a terminal disclaimer.

(21) Appl. No.: 14/194,564

(22) Filed: Feb. 28, 2014

(65) Prior Publication Data

US 2014/0238865 A1    Aug. 28, 2014

Related U.S. Application Data

(63) Continuation of application No. 13/409,950, filed on Mar. 1, 2012, now Pat. No. 8,808,800, which is a continuation of application No. 13/006,814, filed on Jan. 14, 2011, now abandoned, which is a continuation of application No. 11/733,195, filed on Apr. 9, 2007, now abandoned, which is a continuation-in-part of application No. 10/434,519, filed on May 7, 2003, now Pat. No. 7,252,861, and a continuation-in-part of application No. 11/029,220, filed on Jan. 3, 2005, now Pat. No. 7,271,888.

(60) Provisional application No. 60/790,327, filed on Apr. 7, 2006, provisional application No. 60/379,130, filed on May 7, 2002, provisional application No.
(Continued)

(51) Int. Cl.
*B81C 1/00* (2006.01)
*C25D 5/02* (2006.01)

(52) U.S. Cl.
CPC ......... *B81C 1/00666* (2013.01); *C25D 5/022* (2013.01)

(58) Field of Classification Search
CPC .............................. B81C 1/00666; C25D 5/02
USPC ....................................................... 205/135
See application file for complete search history.

(56) References Cited

U.S. PATENT DOCUMENTS

| 5,190,637 A | 3/1993 | Guckel |
|---|---|---|
| 5,718,618 A | 2/1998 | Guckel et al. |
| 6,027,630 A | 2/2000 | Cohen |

(Continued)

*Primary Examiner* — Xiao Zhao
(74) *Attorney, Agent, or Firm* — Dennis R. Smalley

(57) ABSTRACT

Electrochemical fabrication processes and apparatus for producing single layer or multi-layer structures where each layer includes the deposition of at least two materials and wherein the formation of at least some layers includes operations for reducing stress and/or curvature distortion when the structure is released from a sacrificial material which surrounded it during formation and possibly when released from a substrate on which it was formed. Six primary groups of embodiments are presented which are divide into eleven primary embodiments. Some embodiments attempt to remove stress to minimize distortion while others attempt to balance stress to minimize distortion.

15 Claims, 32 Drawing Sheets

Related U.S. Application Data

60/534,159, filed on Dec. 31, 2003, provisional application No. 60/534,183, filed on Dec. 31, 2003.

(56) References Cited

U.S. PATENT DOCUMENTS

| | | |
|---|---|---|
| 6,056,159 A | 5/2000 | Layer |
| 6,164,850 A * | 12/2000 | Speakman .......... B29C 67/0059 101/483 |
| 6,572,714 B1 | 6/2003 | Kawahara et al. |
| 6,998,358 B2 | 2/2006 | French et al. |
| 7,252,861 B2 | 8/2007 | Smalley |
| 7,271,888 B2 | 9/2007 | Frodis et al. |
| 2003/0087167 A1 | 5/2003 | Popp |
| 2003/0221968 A1 | 12/2003 | Cohen et al. |
| 2005/0023145 A1 | 2/2005 | Cohen et al. |
| 2005/0032375 A1 | 2/2005 | Lockard et al. |
| 2005/0079666 A1 | 4/2005 | French et al. |
| 2005/0230261 A1 | 10/2005 | Cohen et al. |

\* cited by examiner

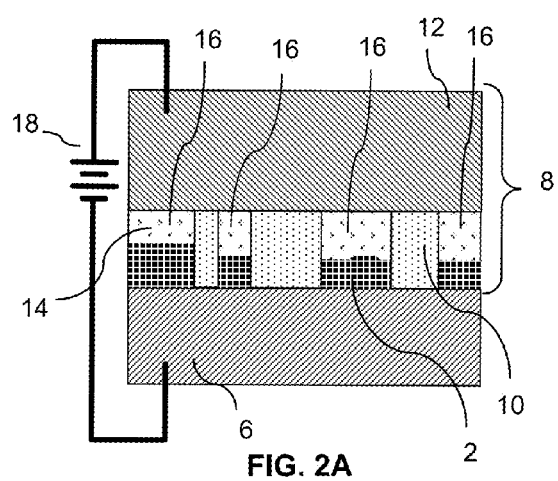
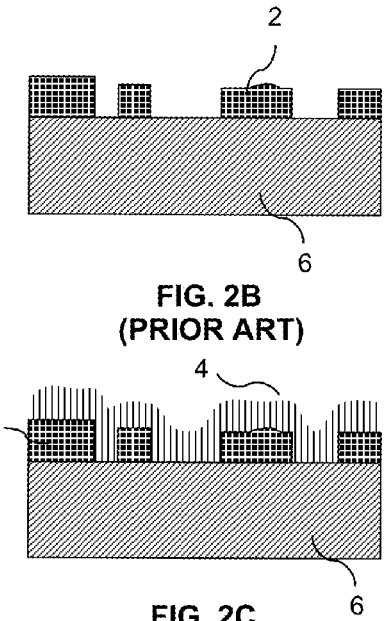
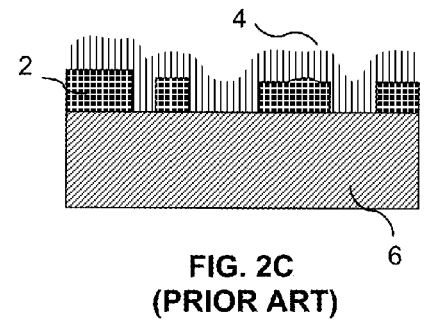
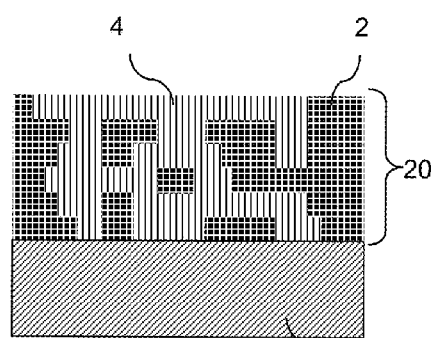
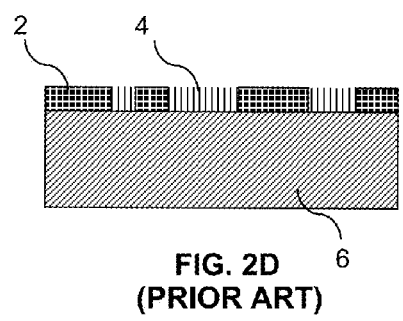
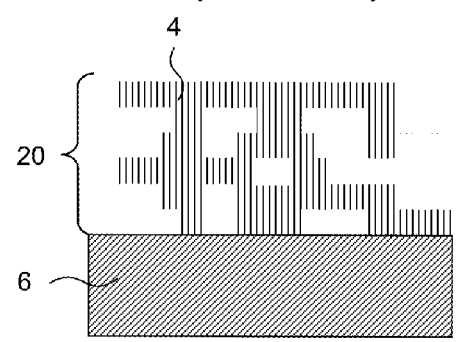
FIG. 2A (PRIOR ART)
FIG. 2B (PRIOR ART)
FIG. 2C (PRIOR ART)
FIG. 2D (PRIOR ART)
FIG. 2E (PRIOR ART)
FIG. 2F (PRIOR ART)

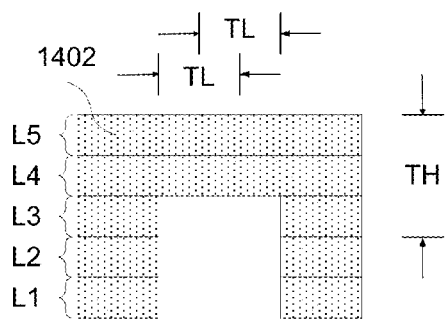
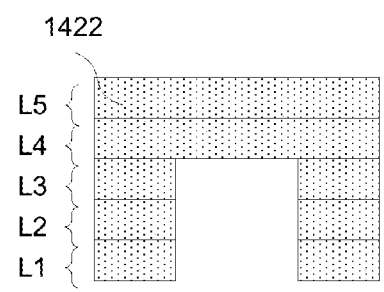
FIG. 13A  FIG.13B
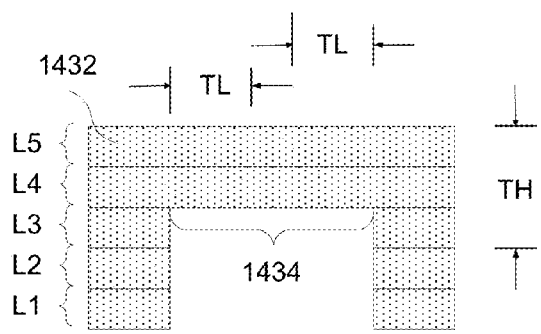
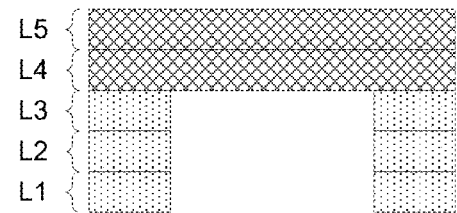
FIG. 14A  FIG. 14B

METHODS OF FORMING THREE-DIMENSIONAL STRUCTURES HAVING REDUCED STRESS AND/OR CURVATURE

RELATED APPLICATIONS

This application is a continuation of U.S. patent application Ser. No. 13/409,950 filed Mar. 1, 2012. The '950 application is a continuation of U.S. patent application Ser. No. 13/006,814, filed Jan. 14, 2011. The '814 application is a continuation of U.S. patent application Ser. No. 11/733,195, filed Apr. 9, 2007. The '195 application claims benefit to U.S. Provisional Patent Application No. 60/790,327, filed Apr. 7, 2006 and the '195 application is a continuation-in-part of U.S. patent application Ser. No. 10/434,519, filed May 7, 2003, now U.S. Pat. No. 7,252,861 issued Aug. 7, 2007; and Ser. No. 11/029,220, filed Jan. 3, 2005, now U.S. Pat. No. 7,271,888 issued Sep. 18, 2007. The '519 application claims benefit of U.S. Provisional Patent Application No. 60/379,130, filed May 7, 2002. The '220 application claims benefit of U.S. Provisional Patent Application Nos. 60/534,159 and 60/534,183, both filed Dec. 31, 2003. These referenced applications are incorporated herein by reference as if set forth in full herein

FIELD OF THE INVENTION

Embodiments of this invention relate to the field of electrochemical fabrication and the associated formation of micro-scale or meso-scale single layer or multi-layer three-dimensional structures and more specifically to the use of electrochemical fabrication processes that produce three-dimensional single layer or multi-layer structures having reduced stress, curvature, and/or other stress induced distortions.

BACKGROUND OF THE INVENTION

An electrochemical fabrication technique for forming three-dimensional structures from a plurality of adhered layers is being commercially pursued by Microfabrica Inc. (formerly MEMGen® Corporation) of Van Nuys, Calif. under the name EFAB™.

Various electrochemical fabrication techniques were described in U.S. Pat. No. 6,027,630, issued on Feb. 22, 2000 to Adam Cohen. Some embodiments of this electrochemical fabrication technique allows the selective deposition of a material using a mask that includes a patterned conformable material on a support structure that is independent of the substrate onto which plating will occur. When desiring to perform an electrodeposition using the mask, the conformable portion of the mask is brought into contact with a substrate, but not adhered or bonded to the substrate, while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single selective deposits of material or may be used in a process to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—"Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

An electrochemical deposition for forming multilayer structures may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate. Typically this material is either a structural material or a sacrificial material.

2. Then, blanket depositing at least one additional material by electrodeposition so that the additional deposit covers both the regions that were previously selectively deposited onto, and the regions of the substrate that did not receive any previously applied selective depositions. Typically this material is the other of a structural material or a sacrificial material.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to an immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed. The removed material is a sacrificial material while the material that forms part of the desired structure is a structural material.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated (the pattern of conformable material is complementary to the pattern of material to be deposited). At least one CC mask is used for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for multiple CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of (1) the substrate, (2) a previously formed layer, or (3) a previously deposited portion of a layer on which deposition is to occur. The pressing together of the CC mask and relevant substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-10. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6, separated from mask 8, onto which material will be deposited during the process of forming a layer. CC mask plating selectively deposits material 22 onto substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 10.

The CC mask plating process is distinct from a "through-mask" plating process in that in a through-mask plating process the separation of the masking material from the substrate would occur destructively. Furthermore in a through mask plating process, opening in the masking material are typically formed while the masking material is in contact with and adhered to the substrate. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the substrate on which plating is to occur (e.g. separate from a three-dimensional (3D) structure that is being formed). CC masks may be formed in a variety of ways, for example, using a photolithographic process. All masks can be generated simultaneously, e.g. prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

The '630 patent additionally teaches that the electroplating methods disclosed therein can be used to manufacture elements having complex microstructure and close tolerances between parts. An example is given with the aid of FIGS. 14A-14E of that patent. In the example, elements having parts that fit with close tolerances, e.g., having gaps between about 1-5 um, including electroplating the parts of the device in an unassembled, preferably pre-aligned, state and once fabricated. In such embodiments, the individual parts can be moved into operational relation with each other or they can simply fall together. Once together the separate parts may be retained by clips or the like.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing through mask exposures. A first layer of a primary metal is electroplated onto an exposed plating base to fill a void in a photoresist (the photoresist forming a through mask having a desired pattern of openings), the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist over the first layer and patterning it (i.e. to form a second through mask) and then repeating the process that was used to produce the first layer to produce a second layer of desired configuration. The process is repeated until the entire structure is formed and the secondary metal is removed by etching. The photoresist is formed over the plating base or previous layer by casting and patterning of the photoresist (i.e. voids formed in the photoresist) are formed by exposure of the photoresist through a patterned mask via X-rays or UV radiation and development of the exposed or unexposed areas.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial layer of sacrificial material (i.e. a layer or coating of a single material) on the substrate so that the structure and substrate may be detached if desired. In such cases after formation of the structure the sacrificial material forming part of each layer of the structure may be removed along the initial sacrificial layer to free the structure. Substrate materials mentioned in the '637 patent include silicon, glass, metals, and silicon with protected semiconductor devices. A specific example of a plating base includes about 150 angstroms of titanium and about 300 angstroms of nickel, both of which are sputtered at a temperature of 160° C. In another example it is indicated that the plating base may consist of 150 angstroms of titanium and 150 angstroms of nickel where both are applied by sputtering.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide an enhanced electrochemical fabrication process capable of forming structures with reduced internal stress.

It is an object of some embodiments of the invention to provide an enhanced electrochemical fabrication process capable of forming structures exhibiting reduced curvature distortion.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object of the invention ascertained from the teachings herein. It is not necessarily intended that all objects be addressed by any single aspect of the invention even though that may be the case with regard to some aspects.

Each of the first through fourteenth aspects of the invention provide a method of forming a multi-layer three-dimensional structure, including: (A) forming a plurality of successive layers of the structure with each successive layer, except for a first layer, adhered to a previously formed layer and with each successive layer comprising at least two materials, one of which is a structural material and the other of which is a sacrificial material, and wherein each successive layer defines a successive cross-section of the three-dimensional structure, and wherein the forming of each of the plurality of successive layers includes: (i) depositing a first of the at least two materials; (ii) depositing a second of the at least two materials; and (B) after the forming of the plurality of successive layers, separating at least a portion of the sacrificial material from the structural material to reveal the three-dimensional structure.

The first aspect of the invention additionally includes, in association with the formation of at least one of the successive layers, dividing the layer into a first thin sublayer and a second thicker sublayer and depositing a primary structural material in a lateral region of the first sublayer to form at least a portion of the sublayer, and thereafter planarizing the primary structural material to a height that bounds the first sublayer, where the thickness of the first sublayer is similar to a known or estimated effective work hardened thickness (e.g. preferably having a thickness between ⅓ and 3 times that of the estimated or known effective work hardened thickness, more preferably between ½ and 2 times that of the estimated or known effective work hardened thickness, even more preferably within 2/3 and 3/2 times that of the estimated or known effective work hardened thickness, even more preferably between 4/5 and 5/4 times that of the estimated or known effective work hardened thickness, and most preferably between 9/10 and 10/9 times that of the estimated or known effective work hardened thickness) or less than a known or estimated effective work hardened thickness induced by the planarization operation, and thereafter depositing the primary structural material in a lateral region of the second sublayer, and thereafter planarizing the primary structural material of the second sublayer.

The second aspect of the invention additionally includes, in association with the formation of at least one of the successive layers, dividing the layer into a first thin sublayer and a second thicker sublayer, where the thickness of the first sublayer is substantially less than that of the second sublayer thickness (e.g. it is preferably less than 30%, more preferably less than 20%, and most preferably less than 10% of the second sublayer thickness) and depositing a primary structural material in a lateral region of the first sublayer to form at least a portion of the sublayer, and thereafter planarizing the primary structural material to a height that bounds the first sublayer, and thereafter depositing the primary structural material in a lateral region of the second sublayer, and thereafter planarizing the primary structural material of the second sublayer.

The third aspect of the invention additionally includes, in association with the formation of a first layer to which each successive layer will be adhered, depositing a primary structural material in a lateral region of the first layer to form at least a portion of the first layer, thereafter planarizing the upper surface of the first layer, prior to or after forming one or more successive layers, planarizing the bottom surface of the first layer.

The fourth aspect of the invention additionally includes, forming one or more successive layers on one or more previously formed layers such that the one or more layers are formed on the upper surfaces of the one or more previously formed layers and then reversing a build orientation such that one or more additional layers are formed on the bottom surface of a first formed layer of the previously formed layer or layers.

The fifth aspect of the invention additionally includes, in association with the formation of at least one of the successive layers, depositing a primary structural material in a lateral region of the layer to form at least a majority of the one successive layer in the lateral region, and thereafter planarizing the primary structural material to a height that bounds or exceeds the desired height of the at least one successive layer and such that at least a portion of the primary structural material is work hardened, etching into the primary structural material to form one or more openings that extend into the one successive layer in a least a portion of the lateral region to remove at least a portion of the work hardened primary structural material.

The sixth aspect of the invention additionally includes, in association with the formation of at least one of the successive layers, depositing a primary structural material in a lateral region of the layer to form at least a majority of the one successive layer in the lateral region, and thereafter planarizing the primary structural material to form a surface of the one successive layer, and thereafter sequentially exposing portions of the surface to selected radiation that provides the exposed portions with an elevated temperature and results in less distortion of the lateral region after the separating than would exist in absence of the exposing.

The seventh aspect of the invention additionally includes, in association with the formation of at least one of the successive layers, depositing a primary structural material in a lateral region of the layer to form at least a majority of the one successive layer in the lateral region, and thereafter planarizing the primary structural material to form a surface of the one successive layer, and thereafter sequentially exposing portions of the surface to selected laser radiation which results in less distortion of the lateral region after the separating than would exist in absence of the exposing.

The eighth aspect of the invention additionally includes, in association with the formation of at least one of the successive layers, depositing a primary structural material in a lateral region of the layer to form at least a majority of the one successive layer in the lateral region, and thereafter planarizing the primary structural material to form a surface of the one successive layer, and thereafter exposing at least a portion of the surface to selected radiation which results in less distortion of the lateral region after the separating than would exist in absence of the exposing.

The ninth aspect of the invention additionally includes, in association with the formation of at least one of the successive layers, depositing a primary structural material in a lateral region of the layer to form at least a majority of the one successive layer in the lateral region, and thereafter planarizing the primary structural material to form a surface of the one successive layer, and thereafter applying heat to selected portions of the surface or to the surface as a whole which results in less distortion of the lateral region after the separating than would exist in absence of the heating The tenth aspect of the invention additionally includes forming at least one layer such that a primary structural material on the layer is provided with an upper surface configuration that is not planar but instead is made to include a plurality of alternating surface recessions and elevations (e.g. where the recessions are relatively narrow. e.g. preferably narrower than 10 um, more preferably narrower than 5 um, even more preferably thinner than 2 um, and most preferably thinner than 1 um) and where the height difference between the recessions and elevations is preferably larger than a depth of work hardening that the surface of the layer may experience during a planarization operations) which provide decoupling of stress found within the elevations The eleventh aspect of the invention additionally includes, forming at least one layer such that a primary structural material on the layer is provided with an upper surface configuration, planarizing the upper surface, and thereafter forming notches in the planarized surface in a desired pattern where the notches provide decoupling of stress located in separated regions of structural material.

The twelfth aspect of the invention additionally includes, in association with the formation of at least one of the successive layers, depositing a primary structural material in a lateral region of the layer to form the majority of the one successive layer in the lateral region, wherein the primary structural material is a material that cannot be planarized reasonably and effectively by diamond fly cutting and thereafter depositing a secondary structural material in the lateral region of the one successive layer over the primary structural material, wherein the secondary structural material can be planarized reasonably and effectively by diamond fly cutting, and then planarizing the secondary structural material using diamond fly cutting.

The thirteenth aspect of the invention additionally includes, in association with the formation of at least one of the successive layers, depositing a primary structural material in a lateral region of the layer to form the majority of the one successive layer in the lateral region, and thereafter depositing a secondary structural material in the lateral region of the one successive layer over the primary structural material, wherein the secondary structural material has a higher tensile stress than the primary structural material, and then planarizing the secondary structural material without planarizing the primary structural material.

The fourteenth aspect of the invention additionally includes in association with the formation of at least one of the successive layers, depositing a primary structural material in a lateral region of the layer to form at least a majority of the one successive layer in the lateral region, and thereafter planarizing the primary structural material to a height that is less than a desired height of the layer and thereafter depositing at least one secondary structural material to the lateral region to bring the height of the deposited primary and secondary structural materials to a height at least as great as the desired height of the layer, wherein the secondary structural material has a tensile stress greater than a tensile stress of the primary structural material prior to the planarization of the primary structural material.

Additional aspects of the invention provide the additions of the above noted aspects to the formation of the single layers structures as opposed to multiple layer structures.

Additional aspects of the invention provide products produced by the above noted method aspects of the invention.

Further aspects of the invention will be understood by those of skill in the art upon reviewing the teachings herein. Other aspects of the invention may involve apparatus that can be used in implementing one or more of the above process aspects of the invention or devices formed using one of the above process aspects of the invention. These other aspects of the invention may provide various combinations of the aspects, embodiments, and associated alternatives explicitly set forth herein as well as provide other configurations, structures, functional relationships, and processes that have not been specifically set forth above.

BRIEF DESCRIPTION OF THE DRAWINGS

FIGS. 2A-2F schematically depict side views of various stages of an electrochemical fabrication process as applied to the formation of a particular structure where a sacrificial material is selectively deposited while a structural material is blanket deposited.

FIGS. 13A-14B provide side views of cantilever structures supported from both ends where length and thickness requirements are specified for special identification or where layers of structural material are distinguished depending on whether or not they meet the identification requirements.

DETAILED DESCRIPTION OF PREFERRED EMBODIMENTS

Electrochemical Fabrication in General

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
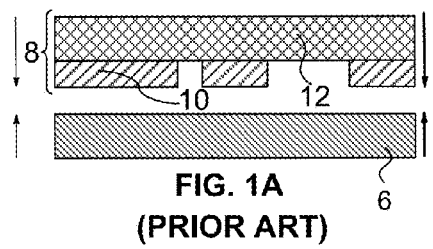
FIGS. 1A-1C schematically depict side views of various stages of a CC mask plating process, while FIGS. 1D-1G schematically depict a side views of various stages of a CC mask plating process using a different type of CC mask.
Figure 1B:
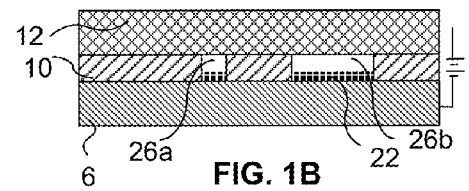
Figure 1C:
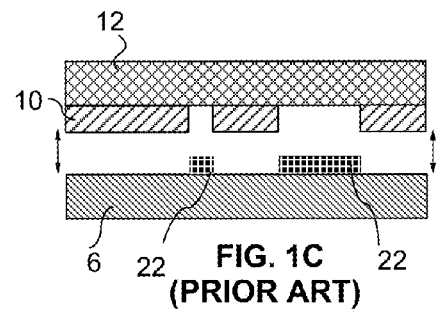
Figure 1D:
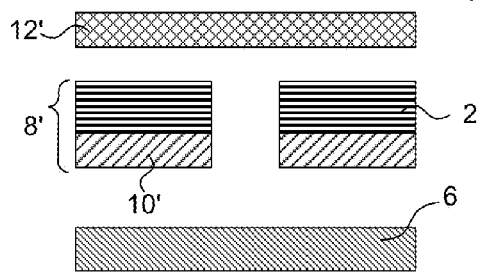
FIGS. 17C-1-17C-2 provide a variation of the first embodiment of the invention where the curvature reduction technique may be applied to only selected lateral portions of layers as opposed to the entire layers and where two optional branches of the process are illustrated
Figure 1E:
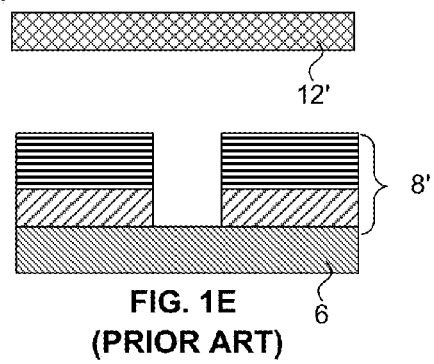
Figure 1F:
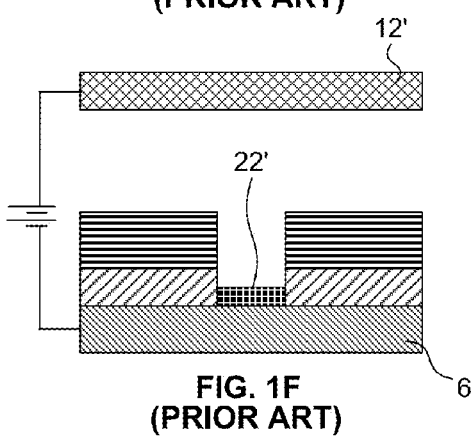
Figure 1G:
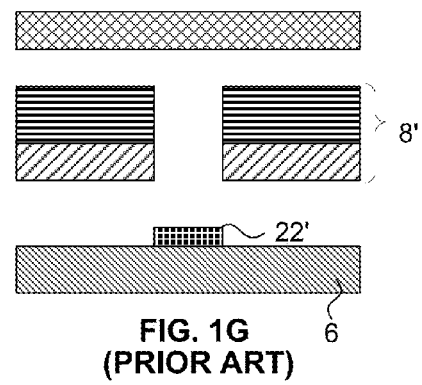
Figure 3A:
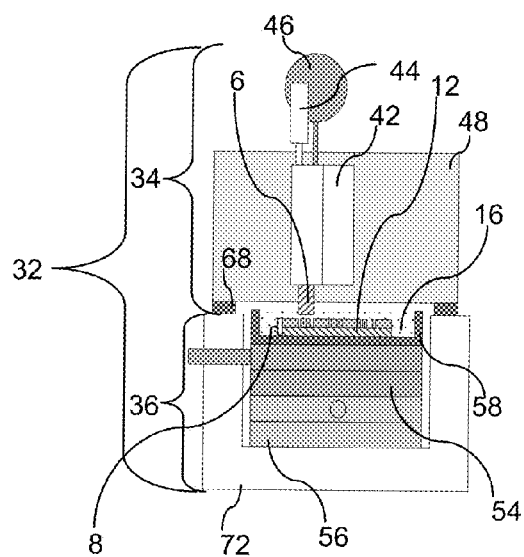
FIGS. 3A-3C schematically depict side views of various example subassemblies that may be used in manually implementing the electrochemical fabrication method depicted in FIGS. 2A-2F.
Figure 3B:
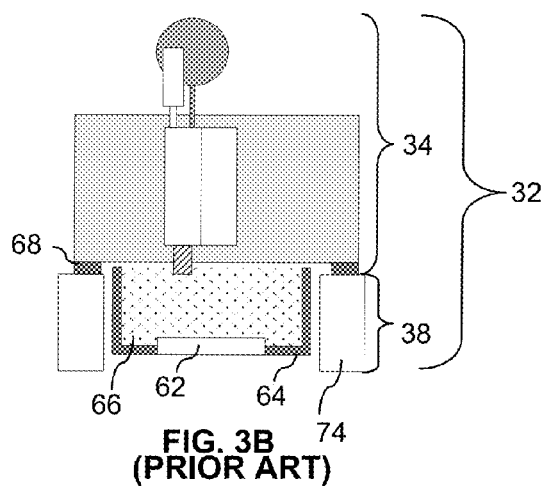
Figure 3C:
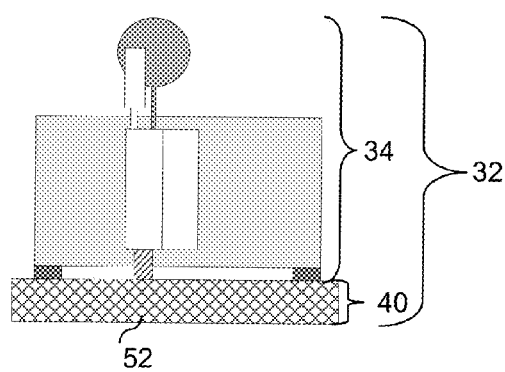
Figure 4A:
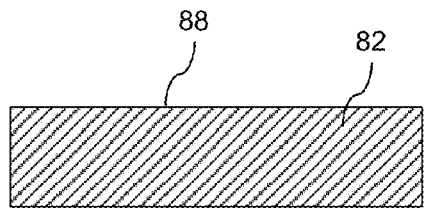
FIGS. 4A-4F schematically depict the formation of a first layer of a structure using adhered mask plating where the blanket deposition of a second material overlays both the openings between deposition locations of a first material and the first material itself
Figure 4B:
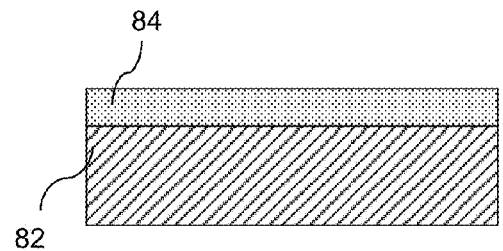
Figure 4C:
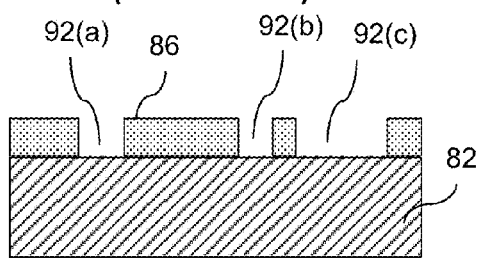
Figure 4D:
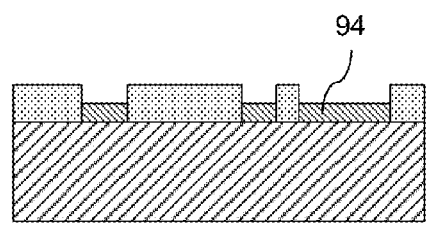
Figure 4E:
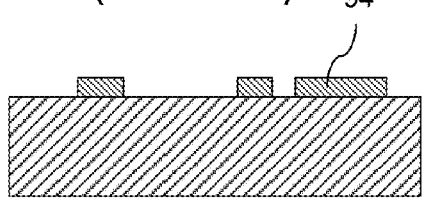
Figure 4F:
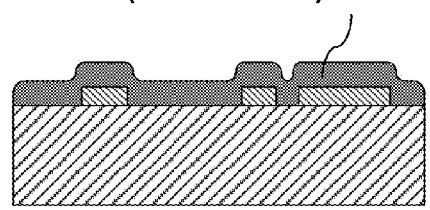
Figure 4G:
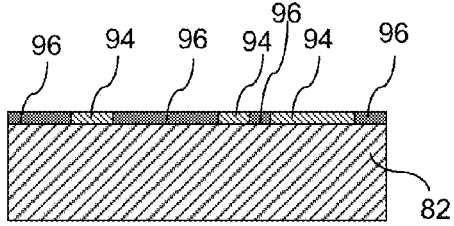
FIG. 4G depicts the completion of formation of the first layer resulting from planarizing the deposited materials to a desired level.
Figure 4H:
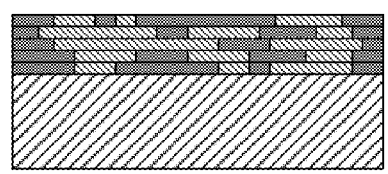
FIGS. 4H and 4I respectively depict the state of the process after formation of the multiple layers of the structure and after release of the structure from the sacrificial material.
Figure 4I:
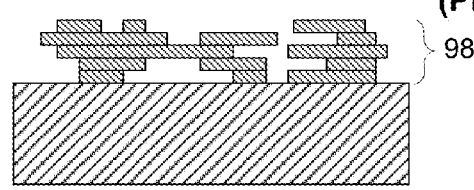

FIGS. 4A-4I illustrate various stages in the formation of a single layer of a multi-layer fabrication process where a second metal is deposited on a first metal as well as in openings in the first metal so that the first and second metal form part of the layer. In FIG. 4A a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D a metal 94 (e.g. nickel) is shown as having been electroplated into the openings 92(a)-92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

Various embodiments of various aspects of the invention are directed to formation of three-dimensional structures from materials some of which may be electrodeposited or electroless deposited. Some of these structures may be formed form a single build level formed from one or more deposited materials while others are formed from a plurality of build layers each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used. In some embodiments structures having features positioned with micron level precision and minimum features size on the order of tens of microns are to be formed. In other embodiments structures with less precise feature placement and/or larger minimum features may be formed. In still other embodiments, higher precision and smaller minimum feature sizes may be desirable.

The various embodiments, alternatives, and techniques disclosed herein may form multi-layer structures using a single patterning technique on all layers or using different patterning techniques on different layers. For example, Various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted, or located in proximity to. Adhered masks are generally formed on the surface to be treated (i.e. the portion of that surface that is to be masked) and bonded to that surface such that they cannot be separated from that surface without being completely destroyed damaged beyond any point of reuse. Adhered masks may be formed in a number of ways including (1) by application of a photoresist, selective exposure of the photoresist, and then development of the photoresist, (2) selective transfer of pre-patterned masking material, and/or (3) direct formation of masks from computer controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration). Such use of selective etching and interlaced material deposition in association with multiple layers is described in U.S. patent application Ser. No. 10/434,519, by Smalley, and entitled "Methods of and Apparatus for Electrochemically Fabricating Structures Via Interlaced Layers or Via Selective Etching and Filling of Voids layer elements" which is hereby incorporated herein by reference as if set forth in full.

Temporary substrates on which structures may be formed may be of the sacrificial-type (i.e. destroyed or damaged during separation of deposited materials to the extent they can not be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g. replanarizing one or more selected surfaces or applying a release layer, and the like) though they may or may not be reused for a variety of reasons.

Definitions

This section of the specification is intended to set forth definitions for a number of specific terms that may be useful in describing the subject matter of the various embodiments of the invention. It is believed that the meanings of most if not all of these terms is clear from their general use in the specification but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference.

"Build" as used herein refers, as a verb, to the process of building a desired structure or plurality of structures from a plurality of applied or deposited materials which are stacked and adhered upon application or deposition or, as a noun, to the physical structure or structures formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g. 100, 500, 1000, 5000, or more times greater). The planar nature of the deposited or applied materials may come about from use of a process that leads to planar deposits or it may result from a planarization process (e.g. a process that includes mechanical abrasion, e.g. lapping, fly cutting, grinding, or the like) that is used to remove material regions of excess height. Unless explicitly noted otherwise, "vertical" as used herein refers to the build axis or nominal build axis (if the layers are not stacking with perfect registration) while "horizontal" refers to a direction within the plane of the layers (i.e. the plane that is substantially perpendicular to the build axis).

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layers such that the openings in the previous build layers are filled with materials deposited in association with current build layers which will cause interlacing of build layers and material deposits. Such interlacing is described in U.S. patent application Ser. No. 10/434,519. This referenced application is incorporated herein by reference as if set forth in full. In most embodiments, a build layer includes at least one primary structural material and at least one primary sacrificial material. However, in some embodiments, two or more primary structural materials may used without a primary sacrificial material (e.g. when one primary structural material is a dielectric and the other is a conductive material). In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower layer boundaries may be defined in a variety of different ways. For example by planarization levels or effective planarization levels (e.g. lapping levels, fly cutting levels, chemical mechanical polishing levels, mechanical polishing levels, vertical positions of structural and/or sacrificial materials after relatively uniform etch back following a mechanical or chemical mechanical planarization process). For example, by levels at which process steps or operations are repeated. At levels at which, at least theoretically, lateral extends of structural material can be changed to define new cross-sectional features of a structure.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g. within 20%, 10%, 5%, or even 1% of a desired layer boundary level). For example, lapping removes material in a substantially non-selective manner though some amount of recession one material or another may occur (e.g. copper may recess relative to nickel). Planarization may occur primarily via mechanical means, e.g. lapping, grinding, fly cutting, milling, sanding, abrasive polishing, frictionally induced melting, other machining operations, or the like (i.e. mechanical planarization). Mechanical planarization maybe followed or proceeded by thermally induced planarization (e.g. melting) or chemically induced planarization (e.g. etching). Planarization may occur primarily via a chemical and/or electrical means (e.g. chemical etching, electrochemical etching, or the like). Planarization may occur via a simultaneous combination of mechanical and chemical etching (e.g. chemical mechanical polishing (CMP)).

"Structural material" as used herein refers to a material that remains part of the structure when put into use.

"Supplemental structural material" as used herein refers to a material that forms part of the structure when the structure is put to use but is not added as part of the build layers but instead is added to a plurality of layers simultaneously (e.g. via one or more coating operations that applies the material, selectively or in a blanket fashion, to a one or more surfaces of a desired build structure that has been released from a sacrificial material.

"Primary structural material" as used herein is a structural material that forms part of a given build layer and which is typically deposited or applied during the formation of that build layer and which makes up more than 20% of the structural material volume of the given build layer. In some embodiments, the primary structural material may be the same on each of a plurality of build layers or it may be different on different build layers. In some embodiments, a given primary structural material may be formed from two or more materials by the alloying or diffusion of two or more materials to form a single material.

"Secondary structural material" as used herein is a structural material that forms part of a given build layer and is typically deposited or applied during the formation of the given build layer but is not a primary structural material as it individually accounts for only a small volume of the structural material associated with the given layer. A secondary structural material will account for less than 20% of the volume of the structural material associated with the given layer. In some preferred embodiments, each secondary structural material may account for less than 10%, 5%, or even 2% of the volume of the structural material associated with the given layer. Examples of secondary structural materials may include seed layer materials, adhesion layer materials, barrier layer materials (e.g. diffusion barrier material), and the like. These secondary structural materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931. In other embodiments, such coatings may be applied in a non-planar manner, for example, in openings in and over a patterned masking material that has been applied to previously planarized layers of material as taught in U.S. patent application Ser. No. 10/841,383. These referenced applications are incorporated herein by reference as if set forth in full herein.

"Functional structural material" as used herein is a structural material that would have been removed as a sacrificial material but for its actual or effective encapsulation by other structural materials. Effective encapsulation refers, for example, to the inability of an etchant to attack the functional structural material due to inaccessibility that results from a very small area of exposure and/or due to an elongated or tortuous exposure path. For example, large (10,000 $\mu m^2$) but thin (e.g. less than 0.5 microns) regions of sacrificial copper sandwiched between deposits of nickel may define regions of functional structural material depending on ability of a release etchant to remove the sandwiched copper.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general sacrificial material is located on a build layer during the formation of one, two, or more subsequent build layers and is thereafter removed in a manner that does not lead to a planarized surface. Materials that are applied primarily for masking purposes, i.e. to allow subsequent selective deposition or etching of a material, e.g. photoresist that is used in forming a build layer but does not form part of the build layer) or that exist as part of a build for less than one or two complete build layer formation cycles are not considered sacrificial materials as the term is used herein but instead shall be referred as masking materials or as temporary materials. These separation processes are sometimes referred to as a release process and may or may not involve the separation of structural material from a build substrate. In many embodiments, sacrificial material within a given build layer is not removed until all build layers making up the three-dimensional structure have been formed. Of course sacrificial material may be, and typically is, removed from above the upper level of a current build layer during planarization operations during the formation of the current build layer. Sacrificial material is typically removed via a chemical etching operation but in some embodiments may be removed via a melting operation or electrochemical etching operation. In typical structures, the removal of the sacrificial material (i.e. release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g. chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal (e.g. layers with stairs steps in regions where smooth sloped surfaces are desired. In such cases the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material such as a metal. As will be discussed hereafter, masking materials though typically sacrificial in nature are not termed sacrificial materials herein unless they meet the required definition of sacrificial material.

"Supplemental sacrificial material" as used herein refers to a material that does not form part of the structure when the structure is put to use and is not added as part of the build layers but instead is added to a plurality of layers simultaneously (e.g. via one or more coating operations that applies the material, selectively or in a blanket fashion, to a one or more surfaces of a desired build structure that has been released from an initial sacrificial material. This supplemental sacrificial material will remain in place for a period of time and/or during the performance of certain post layer formation operations, e.g. to protect the structure that was released from a primary sacrificial material, but will be removed prior to putting the structure to use.

"Primary sacrificial material" as used herein is a sacrificial material that is located on a given build layer and which is typically deposited or applied during the formation of that build layer and which makes up more than 20% of the sacrificial material volume of the given build layer. In some embodiments, the primary sacrificial material may be the same on each of a plurality of build layers or may be different on different build layers. In some embodiments, a given primary sacrificial material may be formed from two or more materials by the alloying or diffusion of two or more materials to form a single material.

"Secondary sacrificial material" as used herein is a sacrificial material that is located on a given build layer and is typically deposited or applied during the formation of the build layer but is not a primary sacrificial materials as it individually accounts for only a small volume of the sacrificial material associated with the given layer. A secondary sacrificial material will account for less than 20% of the volume of the sacrificial material associated with the given layer. In some preferred embodiments, each secondary sacrificial material may account for less than 10%, 5%, or even 2% of the volume of the sacrificial material associated with the given layer. Examples of secondary structural materials may include seed layer materials, adhesion layer materials, barrier layer materials (e.g. diffusion barrier material), and the like. These secondary sacrificial materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931. In other embodiments, such coatings may be applied in a non-planar manner, for example, in openings in and over a patterned masking material that has been applied to previously planarized layers of material as taught in U.S. patent application Ser. No. 10/841,383. These referenced applications are incorporated herein by reference as if set forth in full herein.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e. partially formed) build layer so that a non-planar seed layer results, or they may be selectively applied to only certain locations on a previously formed build layer. In the event such coatings are non-selectively applied, selected portions may be removed (1) prior to depositing either a sacrificial material or structural material as part of a current layer or (2) prior to beginning formation of the next layer or they may remain in place through the layer build up process and then etched away after formation of a plurality of build layers.

"Masking material" is a material that may be used as a tool in the process of forming a build layer but does not form part of that build layer. Masking material is typically a photopolymer or photoresist material or other material that may be readily patterned. Masking material is typically a dielectric. Masking material, though typically sacrificial in nature, is not a sacrificial material as the term is used herein. Masking material is typically applied to a surface during the formation of a build layer for the purpose of allowing selective deposition, etching, or other treatment and is removed either during the process of forming that build layer or immediately after the formation of that build layer.

"Multilayer structures" are structures formed from multiple build layers of deposited or applied materials.

"Multilayer three-dimensional (or 3D or 3-D) structures" are Multilayer Structures that meet at least one of two criteria: (1) the structural material portion of at least two layers of which one has structural material portions that do not overlap structural material portions of the other.

"Complex multilayer three-dimensional (or 3D or 3-D) structures" are multilayer three-dimensional structures formed from at least three layers where a line may be defined that hypothetically extends vertically through at least some portion of the build layers of the structure will extend from structural material through sacrificial material and back through structural material or will extend from sacrificial material through structural material and back through sacrificial material (these might be termed vertically complex multilayer three-dimensional structures). Alternatively, complex multilayer three-dimensional structures may be defined as multilayer three-dimensional structures formed from at least two layers where a line may be defined that hypothetically extends horizontally through at least some portion of a build layer of the structure that will extend from structural material through sacrificial material and back through structural material or will extend from sacrificial material through structural material and back through sacrificial material (these might be termed horizontally complex multilayer three-dimensional structures). Worded another way, in complex multilayer three-dimensional structures, a vertically or horizontally extending hypothetical line will extend from one or structural material or void (when the sacrificial material is removed) to the other of void or structural material and then back to structural material or void as the line is traversed along at least a portion of the line.

"Moderately complex multilayer three-dimensional (or 3D or 3-D) structures" are complex multilayer 3D structures for which the alternating of void and structure or structure and void not only exists along one of a vertically or horizontally extending line but along lines extending both vertically and horizontally.

"Highly complex multilayer (or 3D or 3-D) structures" are complex multilayer 3D structures for which the structure-to-void-to-structure or void-to-structure-to-void alternating occurs once along the line but occurs a plurality of times along a definable horizontally or vertically extending line.

"Up-facing feature" is an element dictated by the cross-sectional data for a given build layer "n" and a next build layer "n+1" that is to be formed from a given material that exists on the build layer "n" but does not exist on the immediately succeeding build layer "n+1". For convenience the term "up-facing feature" will apply to such features regardless of the build orientation.

"Down-facing feature" is an element dictated by the cross-sectional data for a given build layer "n" and a preceding build layer "n−1" that is to be formed from a given material that exists on build layer "n" but does not exist on the immediately preceding build layer "n−1". As with up-facing features, the term "down-facing feature" shall apply to such features regardless of the actual build orientation.

"Continuing region" is the portion of a given build layer "n" that is dictated by the cross-sectional data for the given build layer "n", a next build layer "n+1" and a preceding build layer "n−1" that is neither up-facing nor down-facing for the build layer "n".

"Minimum feature size" refers to a necessary or desirable spacing between structural material elements on a given layer that are to remain distinct in the final device configuration. If the minimum feature size is not maintained on a given layer, the fabrication process may result in structural material inadvertently bridging the two structural elements due to masking material failure or failure to appropriately fill voids with sacrificial material during formation of the given layer such that during formation of a subsequent layer structural material inadvertently fills the void. More care during fabrication can lead to a reduction in minimum feature size or a willingness to accept greater losses in productivity can result in a decrease in the minimum feature size. However, during fabrication for a given set of process parameters, inspection diligence, and yield (successful level of production) a minimum design feature size is set in one way or another. The above described minimum feature size may more appropriately be termed minimum feature size of sacrificial material regions. Conversely a minimum feature size for structure material regions (minimum width or length of structural material elements) may be specified. Depending on the fabrication method and order of deposition of structural material and sacrificial material, the two types of minimum feature sizes may be different. In practice, for example, using electrochemical fabrication methods and described herein, the minimum features size on a given layer may be roughly set to a value that approximates the layer thickness used to form the layer and it may be considered the same for both structural and sacrificial material widths and lengths. In some more rigorously implemented processes, examination regiments, and rework requirements, it may be set to an amount that is 80%, 50%, or even 30% of the layer thickness. Other values or methods of setting minimum feature sizes may be set.

"Sublayer" as used herein refers to a portion of a build layer that typically includes the full lateral extents of that build layer but only a portion of its height. A sublayer is usually a vertical portion of build layer that undergoes independent processing compared to another sublayer of that build layer.

Stress, Curvature, and Regions of Structures

When forming structures using the electrochemical fabrication methods discussed above, structures or portions of structures may be formed with unintended curvature. This curvature appears to be more prevalence when the thickness between down-facing and overlying up-facing regions is relatively thin (e.g. under 30-60 microns). It appears as the thickness of the structural elements increase the tendency to curve decreases as the overall structure becomes more rigid and less capable of distorting under the load of any unbalanced stresses that were built into the structure. The unintended curvature in the structures themselves cannot be seen prior to the release of the structures (i.e. structural material) from the surrounding sacrificial materials and possibly from the substrate itself. However, at times, unintended curvature can be seen in the build layers themselves particularly when the total thickness of deposited layers becomes relatively thick (e.g. in excess of 700 to 1500 microns) and the lateral (i.e. horizontal extents when the build axis is considered to extend vertically) of the build layers increase (e.g. beyond 100 mm). The build layer curvature may or may not translate into curvature of the build structures themselves depending on the horizontal dimensions of the build structures themselves, the thickness of the structures, whether or not they remained adhered to the substrate, their overall configurations, and the like. Though this application is primarily focused on reducing stress and/or unintended curvature in structures themselves, curvature of build layers is something that can lead to formational difficulties and illustrates the inherent stress, or at least unbalanced stress, that can exist in build layers.

Various techniques exist for minimizing build layer curvature. One such technique includes the use of a thick and very rigid substrate particularly when it is intended that a relatively large thickness of build layers be deposited thereon. Another technique involves the attachment of the substrate to a carrier that tends to stiffen it. Another technique involves the deposition and planarization of material onto the back side of the substrate during the build process to balance the stresses that are induced by the build up of layers on the front side of the substrate. The net amount of material deposited on the back side of the substrate need not be identical to that deposited on the front side and it need not even be the same material. The material deposited onto the back side of the substrate is typically a sacrificial material though it can be structural material or even a mixture of structural and sacrificial material. In fact, in some cases it may be possible to build structures on both sides of the substrate wherein after formation, the structures on both sides of the substrate are released from the sacrificial material and even from the substrate. If the structures are to remain on the substrate they can remain joined with their counterparts on the opposite side of the substrate or they can be separated from their counterparts by slicing the substrate in half (i.e. along a horizontal plane through the substrate).

Figure 5A:
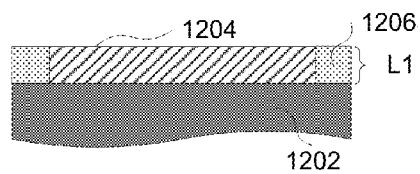
FIGS. 5A-5D provides a comparison between a structure, formed from one layer, that is curvature free and one that has unintended curvature which is released from a substrate.
Figure 5B:
Figure 5C:
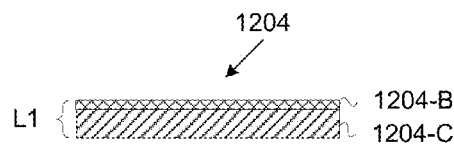
Figure 5D:
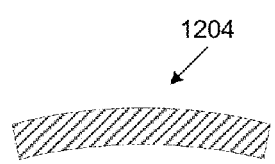

FIGS. 5A-5D provides a comparison between a structure, formed from one layer, that is curvature free and one that has unintended curvature which is released from a substrate. FIG. 5A provides a schematic side view of a structure 1204 formed as a single build layer L1 on a substrate 1202 and which is surrounded by sacrificial material 1206. FIG. 5B depicts the structure 1204 of FIG. 5A as it is intended to look after it is separated from the substrate 1202 and sacrificial material 1206. FIG. 5C depicts the structure 1202 of FIG. 5A as it is intended to look after it is separated from the substrate 1202 and sacrificial material 1206 and wherein worked hardened regions 1204B on the upper portion of each layer are shown along with the lower portion 1204A of structure 1204. Worked hardened regions 1204B may occur via planarization operations that were used to set the upper boundary portion of the build layer L1 from which the structure was formed. The planarization operations setting the boundary level may have involved one or more lapping operations. FIG. 5D depicts the structure of FIG. 5A as it may exist after being formed by a prior art technique where the structure is curved due to excessive unbalanced stresses that were induced in the structure during its formation. In particular, the work hardened region 1204B, prior to separation of the structure 1204 from the substrate 1202, may experience a compressive stress and upon separation from the substrate, the layer as a whole may be insufficiently rigid to resist the release of the compressive stress so that the stress is relieved by the bending of the structure downward thereby providing a slight expansion of the upper portion of the structure and a relief of the compressive force. The structure 1204 of FIG. 5A may be released from the substrate 1202 via destructive removal of a sacrificial substrate (e.g. dissolution by etching) or via a release material located between the structure and a non-sacrificial substrate (not shown).

Figure 6A:
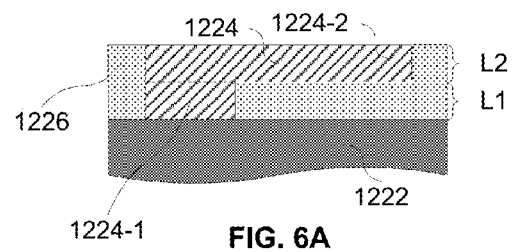
FIGS. 6A-6D provides a comparison between a structure, formed from two layers, that is curvature free and one that has unintended curvature where the second layer is cantilevered relative to the first layer and where the first layer remains adhered to a substrate.
Figure 6B:
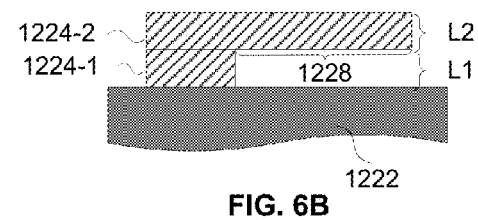
Figure 6C:
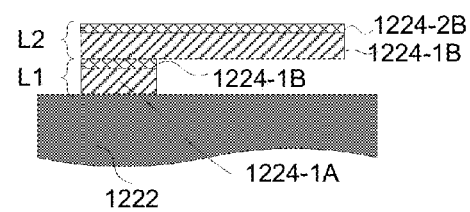
Figure 6D:
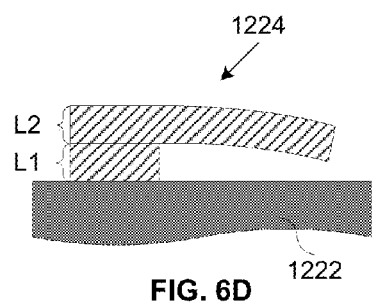

FIGS. 6A-6D provides a comparison between a structure, formed from two layers, that is curvature free and one that has unintended curvature where the second layer is cantilevered relative to the first layer and where the first layer remains adhered to a substrate. FIG. 6A provides a schematic side view of a two layer structure 1224, formed from a first layer L1 and a second layer L2, attached to a substrate 1222 and which is surrounded by sacrificial material 1226 and where the structural material 1224-2 of the second layer extends beyond the structural material 1224-1 of the first layer L1. FIG. 6B depicts the structure 1224 of FIG. 6A as it is intended to look after it is separated from the sacrificial material 1226 which results in a portion 1228 of the structural material 1224-2 of second layer L2 forming an unsupported cantilever section relative to the structural material 1224-1 of the first layer L1. FIG. 6C depicts the structure 1224 of FIG. 6A as it is intended to look after it is separated from the sacrificial material 1226 and wherein worked hardened regions 1224-1B and 1224-2B on the upper portions of the structural material of each of layers L1 and L2 are shown as well as the non-work hardened regions 1224-1A and 1224-2A. FIG. 6D depicts the structure 1224 of FIG. 6A as it may exist after being formed by a prior art technique where the unsupported portion 1228 (i.e. cantilever portion) of second layer 1224-2 is curved downward due to excessive unbalanced stresses that were induced in the structure 1224 during its formation. As shown in this FIG. 6D, the left side of the structural material on the second layer L2 appears to be un-distorted as it is constrained by its doubled thicknesses (i.e. the thickness of layers L1 and L2) and by its attachment to the substrate. As with the structure 1204 of FIG. 5D, the curvature is downward as a result of compressive strain induced in the upper most portion of each layer probably as a result of surface damage introduced in the upper portion of each layer as a result of a stress inducing planarization process (e.g. lapping) that was used to set the boundary level of the layers.

Figure 7A:
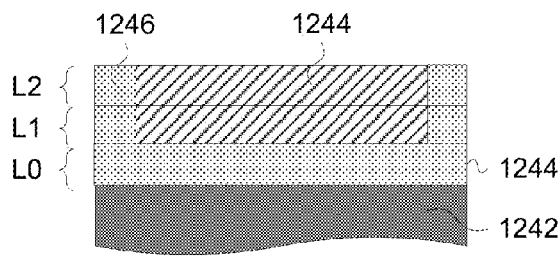
FIGS. 7A-7D provides a comparison between a structure, formed from two layers, that is curvature free and one that has unintended curvature which is released from a substrate via a sacrificial release layer (i.e. a material layer) located between structure and the substrate.
Figure 7B:
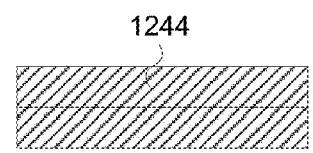
Figure 7C:
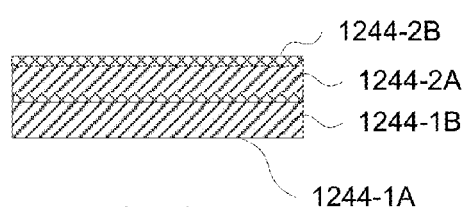
Figure 7D:
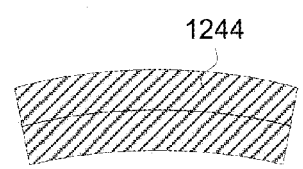

FIGS. 7A-7D provides a comparison between a structure, formed from two layers, that is curvature free and one that has unintended curvature which is released from a substrate via a sacrificial release layer (i.e. a material layer) located between structure and the substrate. FIG. 7A provides a schematic side view of a two layer structure 1244 attached to a substrate 1242, via a sacrificial layer, L0, 1248 (i.e. a single material layer) and which is surrounded by sacrificial material 1246. The structure is formed from structural material 1244-1, on a first build layer L1, and 1244-2, on a second build layer L2. FIG. 7B depicts the structure 1244 of FIG. 7A as it is intended to look after it is separated from the substrate 1242 and sacrificial material 1246. FIG. 7C depicts the structure of FIG. 7A as it is intended to look after it is separated from the substrate and sacrificial material and wherein work hardened regions 1244-1B and 1244-2B on the upper portion of each layer L1 and L2 are shown as well as the non-work hardened regions 1224-1A and 1224-2A. FIG. 7D depicts the structure 1244 of FIG. 7A as it may exist after being formed by a prior art technique where the structure 1244 is curved due to excessive unbalanced stresses that were induced in the structure during its formation.

Figure 8A:
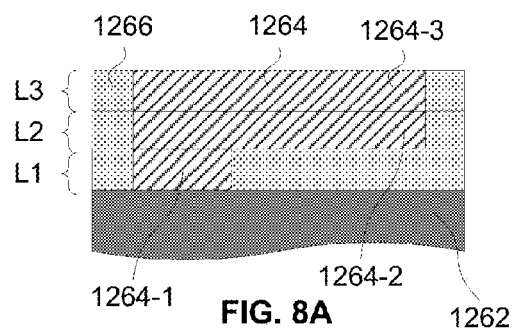
FIGS. 8A-8D provides a comparison between a structure, formed from three layers, that is curvature free and one that has unintended curvature where the second layer is cantilevered relative to the first layer and wherein the first layer remains adhered to a substrate.
Figure 8B:
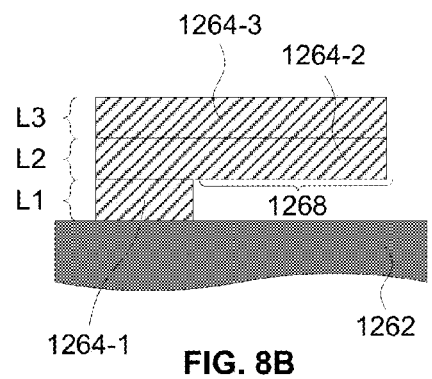
Figure 8C:
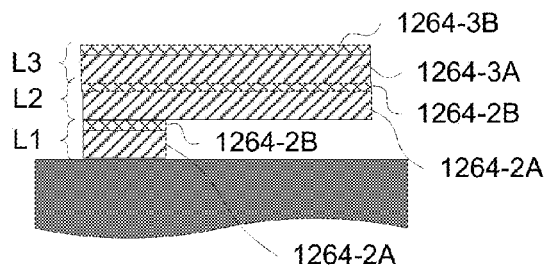
Figure 8D:
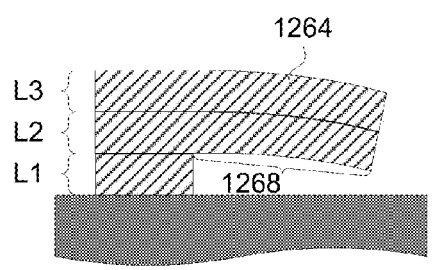

FIGS. 8A-8D provides a comparison between a structure, formed from three layers, that is curvature free and one that has unintended curvature where the second layer is cantilevered relative to the first layer and wherein the first layer remains adhered to a substrate. FIG. 8A provides a schematic side view of a three layer structure 1264 attached to a substrate 1262 and which is surrounded by sacrificial material 1266 and where the structural material 1264-2 and 1264-3 of the second and third layers, L2 and L3, respectively extends beyond the structural material 1264-1 of the first layer L1. FIG. 8B depicts the structure 1264 of FIG. 8A as it is intended to look after it is separated from the sacrificial material 1266 but remains adhered to the substrate 1262 which results in a portion of the structural material on the second and third layers, L2 and L3, defining cantilever 1268 (i.e. a horizontally structure that is unsupported by material existing on previously formed layers). FIG. 8C depicts the structure 1264 of FIG. 8A as it is intended to look after it is separated from the sacrificial material and wherein work hardened regions 1264-1B, 1264-2B, and 1264-3B on the upper portion of each layer L1, L2, and L3 are shown along with regions that are non-work hardened 1264-1A, 1264-2A, and 1264-3A. FIG. 8D depicts the structure 1244 of FIG. 8A as it may exist after being formed by a prior art technique where the unsupported portion 1268 of second and third layers are curved due to excessive unbalanced stresses that were induced in the structure 1264 during its formation.

Figure 9:
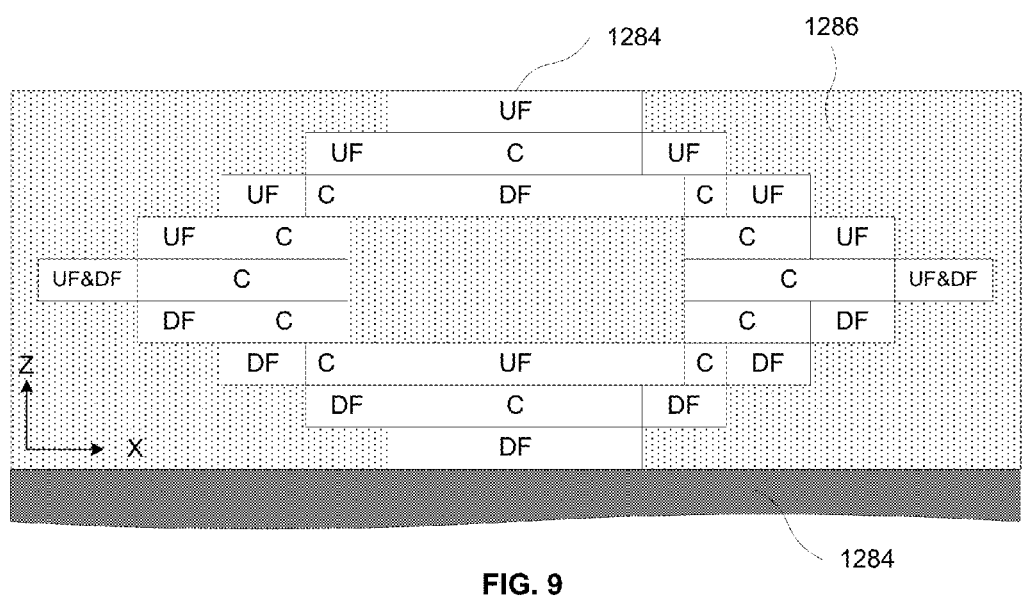
FIG. 9 depicts a side view of an example structure where different portions of the layers of the structure are divided into different categories (up-facing, down-facing, both up- and down-facing, or continuing) based on their geometric relationship to elements of an immediately succeeding layer and to elements of an immediately preceding layer.

FIG. 9 depicts a side view of an example structure where different portions of the layers of the structure are divided into different categories (up-facing, down-facing, both up-facing and down-facing, or continuing) based on their geometric relationship to elements of an immediately succeeding layer and to elements of an immediately preceding layer. In FIG. 9, a structure 1284 is shown surrounded by sacrificial material 1286 and adhered to a substrate 1282. For illustrative purposes the structure is considered to be an extrusion along the y-axis with layers stacked along the z-axis (i.e. the build axis is the x-axis). The structural portion of each layer may be considered to consist of one or more regions depending on the geometric relationship of the structural material to structural material on previous and succeeding layers. The region portions as illustrate here may consist of down-facing regions DF, continuation regions C, up-facing regions UF, and regions that are both up-facing and down facing UF & DF. In the present example the material of structure 1284 is considered to be of a single type, e.g. nickel, nickel-cobalt, nickel phosphorous, silver, or the like. In other embodiments, the structural material on each layer may be different or different on different parts of the same layer. In such cases, regions designations may be base on the distinction between structural materials and sacrificial material, as above, or may be based on distinctions between different structural materials. In still other cases, other region designations may be defined and use. Regions, for example, may be defined (1) as down-facing for one structural material but also as being bounded from below by different structural material, (2) as being only one layer above a down-facing region, (3) as being only two layers below an up-facing region. Regions may be distinguished based on a required horizontal width or length. Regions may be divided into boundary portions and deeper interior portions. A scheme for defining regions should take into account at least two criteria: (1) the scheme provides sufficient information to allow desired formation techniques to be used on different portions of each layer, and (2) the desired regions can be adequately identified and distinguished.

Figure 10A:
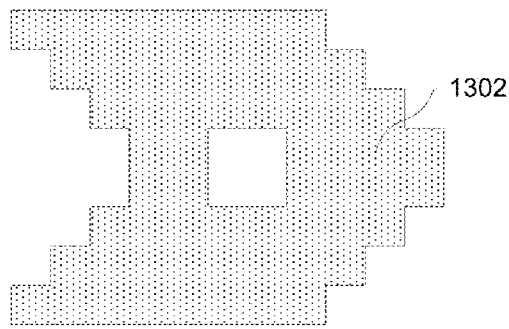
FIGS. 10A and 10B provide side views of two designs of three-dimensional structures that may be cross-sectioned into layers (e.g. eight layers) to produce identical cross-sectional representations that may be the basis for driving the fabrication of identical three-dimensional multi-layer structures.
Figure 10B:
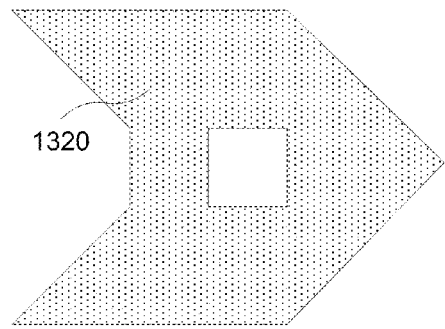

FIGS. 10A and 10B provide side views of two designs of three-dimensional structures that may be cross-sectioned into layers (e.g. eight layers) to produce identical cross-sectional representations that may be the basis for driving the fabrication of identical three-dimensional multi-layer structures. FIG. 10A depicts a structure 1302 that is designed with a stair stepped configuration, along the z-axis, while FIG. 10B depicts a structure 1312 that has smoothly sloping surfaces 1314 along the z-axis. These three-dimensional representations may each be converted into a plurality of cross-sectional representations which may be useful in driving the fabrication of physical multilayer three-dimensional structures. As these cross-sectional representations provide only a quantized approximation of the original three-dimensional designs, it is conceivable that different approximations are possible depending on the sophistication of the data processing used and the structural features that are desired to be emphasized. Rather detailed methods for distinguishing cross-sectional regions and producing cross-sectional representations of three-dimensional structures that emphasis different geometric attributes of original structures are provided in the following U.S. Patents: (1) U.S. Pat. No. 5,321,622, entitled "Boolean Layer Comparison Slice", by Snead et al; and U.S. Pat. No. 6,366,825, entitled "Simultaneous Multiple Layer Curing in Stereolithography", Smalley et al. Each of these patents is incorporated herein by reference as if set forth in full. If it is desired that physically reproduced structures define oversized structures (e.g. structures whose layered solid regions cover all portions of the solid regions of the original design), the basic cross-sectional data and thus the basic configuration of the structural material associated with each build layer, for the designs of FIGS. 10A and 10B, may be identical particularly when these designs are divided into eight cross-sections.

FIGS. 10C-10M provide examples of how different portions of the various cross-sections may be categorized differently to define distinct structural regions so that different fabrication techniques (e.g. curvature reduction techniques) may be applied to the formation of distinct portions of the structure. The cross-sectional data associated with each of these figures is, for example, extractable from the three-dimensional design of either FIG. 10A or 10B.

Figure 10C:
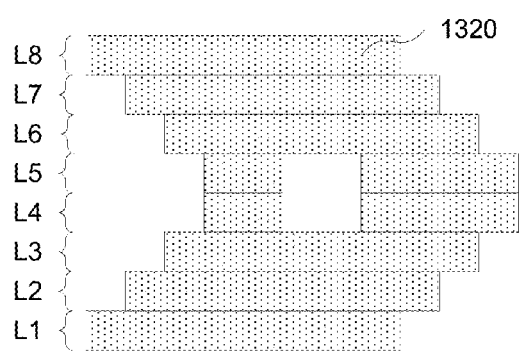
FIGS. 10C-10M provide examples of how different portions of the various cross-sections may be categorized differently to define distinct structural regions so that different fabrication techniques (e.g. curvature reduction techniques) may be applied to the formation of distinct portions of the structure.

FIG. 10C depicts a schematic side view of an example structure formed from eight layers, L1-L8, where the structural material portions 1320 of each layer are shown with identical patterns which are intended to indicate that each structural material portion is defined as having the same attributes (e.g. the cross-sectional data for each layer does not distinguish any special regions of the layers, such as up-facing, down-facing, or continuing regions). Representations of each cross-section have similar attributes and thus be used to drive an electrochemical fabrication process according to some embodiments of the invention where similar curvature reduction techniques will be equally applied to all portions of all layers of the structure.

Figure 10D:
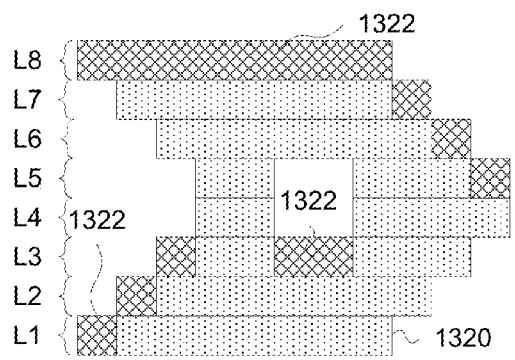

FIG. 10D depicts a schematic side view of an example eight layer structure where up-facing portions 1322 of the structural material for each layer are identified differently from non-up-facing portions 1320 allowing such data to be used to control the formation of the two identified regions differently such that one or the other may be formed using a curvature reduction technique or such that both may be formed using different curvature reduction techniques.

Figure 10E:
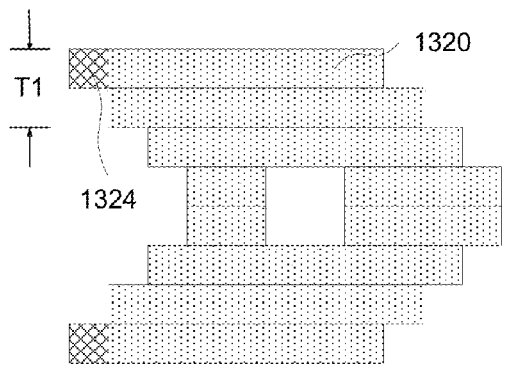

FIG. 10E depicts a schematic side view of an example eight layer structure where special portions 1324 of the structural material 1320 of the layers are identified differently from other structural material portions 1320 when those portions are up-facing and overlay a single layer of structure (i.e. the up-facing portions cap a thin portion of the structure). In other words the special portions are up-facing regions that do not overlie thick regions of structural material (i.e. structural material thicker than one layer). The cut off thickness distinguishing special portions from standard portions is labeled with T1. Such data may be used to control the formation of the two identified regions differently such that one or the other may be formed using a curvature reduction technique or such that both may be formed using different curvature reduction techniques. This data may be used in situations where it is believed that only those portions of a structure thinner than two layer thicknesses are subject to appreciable curvature or where such portions should be subjected to different curvature reduction techniques.

Figure 10F:
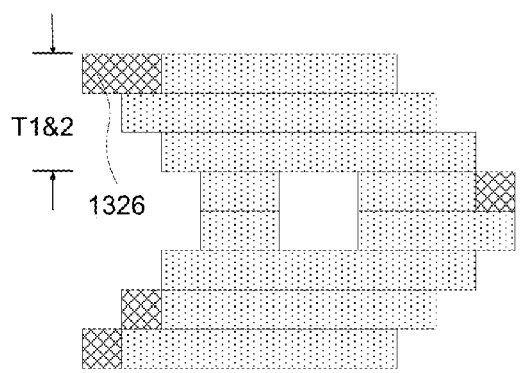

FIG. 10F depicts a schematic side view of an example eight layer structure where special portions 1326 of the structural material of the layers are identified differently from other structural material portions 1320 when those portions are up-facing and overlay structural features thinner than three layer thicknesses (i.e. up-facing regions that do not include up-facing regions that overly structural thicknesses of at least three layers) allowing such data to be used to control the formation of the two identified regions differently such that one or the other may be formed using a curvature reduction technique or such that both may be formed using different curvature reduction techniques. The cut off thickness distinguishing special portions from standard portions is labeled with T1&2.

Figure 10G:
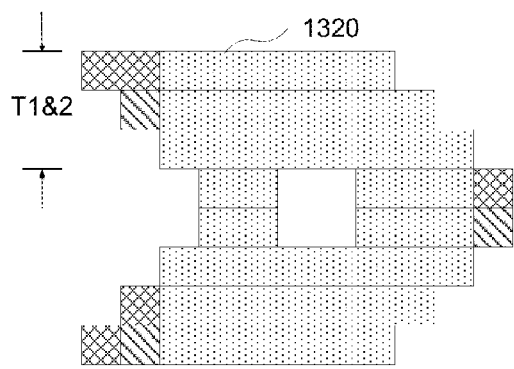

FIG. 10G depicts a schematic side view of an example eight layer structure where special portions 1332 and 1334 of the structural material of layers are identified differently from other structural material portions 1320. Special portions 1332 define up-facing regions that overlay structural material thinner than three layer thicknesses. Special portions 1334 are those portions that immediately underlay up-facing portions where net structural thickness remains less than three layer thicknesses. Defining distinct data for three such regions allows the formation of the structure to occur using up to three different building processes that are geometry specific (e.g. up to three different curvature reduction techniques. The cut off thickness distinguishing special portions from standard portions is labeled with T1&2.

Figure 10H:
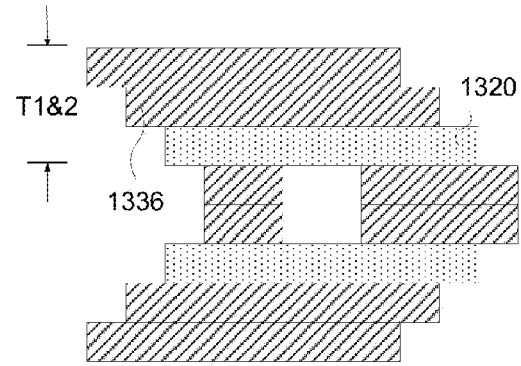

FIG. 10H depicts a schematic side view of an example eight layer structure where structural material portions of layers containing an up-facing features that overlay structural features thinner than three layer thicknesses or layers containing non-facing regions thinner than two layer thickness 1336 are identified differently from layers not containing those regions 1320 thereby allowing such data to be used to control the formation of the two identified regions (i.e. types of layers) differently and such that one or both may be formed using similar or different curvature reduction techniques. This type of identification allows the curvature reduction technique to be selected on a layer by layer basis depending on the geometric configurations which are present on the structural material portion of each layer. The cut off thickness distinguishing special portions from standard portions is labeled with T1&2.

Figure 10I:
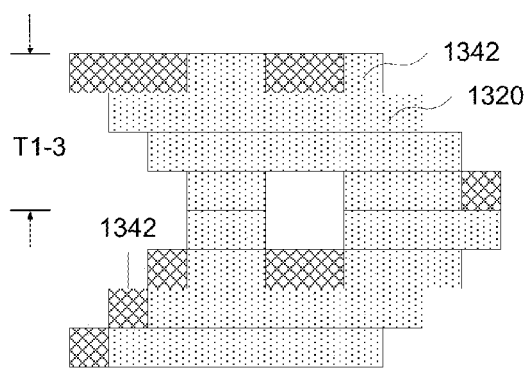

FIG. 10I depicts a schematic side view of an example eight layer structure where up-facing portions 1342 of the structural material portions of layers that overlay structural material features thinner than four layer thicknesses are identified differently from other regions 1320 (i.e. different from non-up-facing regions and up-facing regions that overly structural thicknesses of at least four layers) allowing such data to be used to control the formation of the two identified regions differently such that one or the other may be formed using a curvature reduction technique or such that both may be formed using different curvature reduction techniques. The cut off thickness distinguishing special portions from standard portions is labeled with T1-3.

Figure 10J:
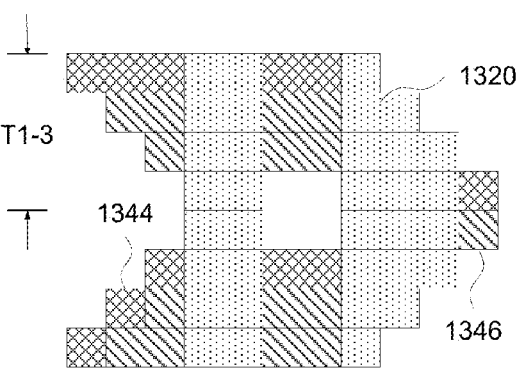

FIG. 10J depicts a schematic side view of an example eight layer structure where up-facing portions 1344 of structural material portions layers that overlay structural features thinner than four layer thicknesses and underlying non-facing regions 1346 are identified differently from other regions 1320 (i.e. different from thick non-up-facing regions, i.e. non-up-facing regions at least three layers in thickness, and up-facing regions that overly structural thicknesses of at least four layers) thereby allowing such data to be used to control the formation of the three identified regions differently and such that one or more may be formed using similar or different curvature reduction techniques. The cut off thickness distinguishing special portions from standard portions is labeled with T1-3.

Figure 10K:
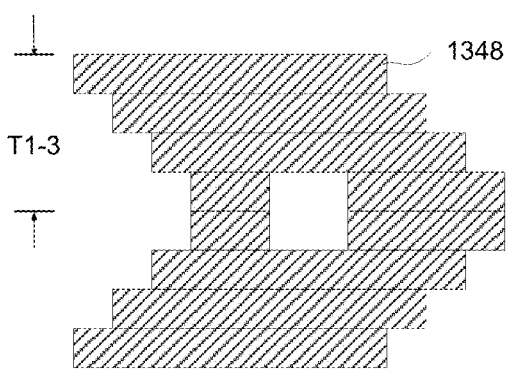

FIG. 10K depicts a schematic side view of an example eight layer structure where layers 1348 containing an up-facing feature that overlays structural features thinner than four layer thicknesses or layers containing non-facing regions thinner than three layer thickness are identified differently from layers not containing those regions. Such identification of layers allows such data to be used to control the formation of the two differently identified regions (in this example only one region results from the specified parameters) differently and such that one or both may be formed using similar or different curvature reduction techniques. The cut off thickness distinguishing special portions from standard portions is labeled with T1-3.

Figure 10L:
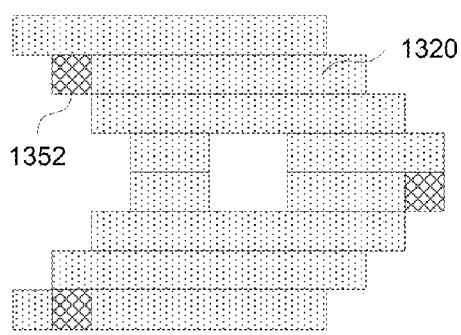

FIG. 10L depicts a schematic side view of an example eight layer structure where down-facing portions 1352 of the structural material of the layers underlay up-facing portions of the structural material on the immediately succeeding layer are distinguished differently from other regions 1320 (i.e. the specially identified portions are those that are both non-up-facing and which are also less than two layers in thickness) thereby allowing such data to be used to control the formation of the two identified regions differently and such that one or both may be formed using different curvature reduction techniques.

Figure 10M:
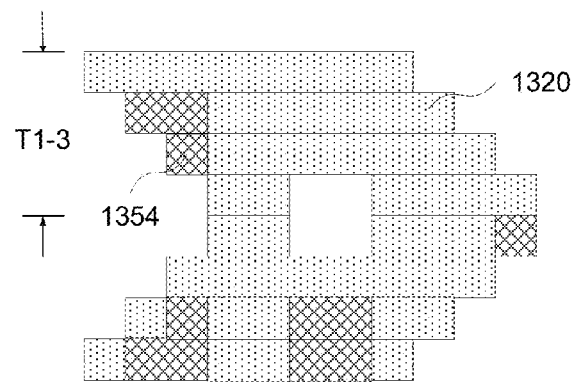

FIG. 10M depicts a schematic side view of a final eight layer example where special regions 1354 are identified as those that are (1) not up-facing portions of layers, (2) define portions of the structural material that having a net thickness less than four layer thicknesses. These special regions 1354 are distinguished from other structural material portions 1320 (i.e. the specially identified portions are those that are both non-up-facing and have thickness of structure that is below them of less than the thickness of three layers. Such data may be used to control the formation of the two identified regions differently and such that one or both may be formed using different curvature reduction techniques.

The identification schemes of FIGS. 10D-10G, 10H-10J, 10L, and 10M may be considered to identify layers containing different feature types as well as defining specific regions within layers, so that distinct curvature reduction techniques may be implemented on region-by-region basis as previously noted or on a layer-by-layer basis depending on the feature types present on individual layers.

FIGS. 11A-12B provide side views of cantilever structures supported from a single side where length and thickness requirements are specified for special identification or where layers of structural material are distinguished depending on whether or not they meet the identification requirements.

Figure 11A:
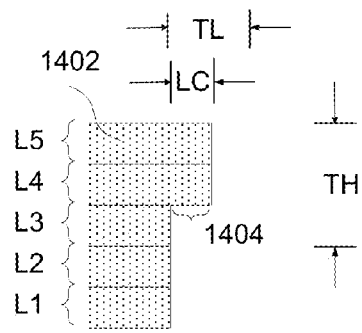
FIGS. 11A-12B provide side views of cantilever structures supported from a single side where length and thickness requirements are specified for special identification or where layers of structural material are distinguished depending on whether or not they meet the identification requirements.

FIG. 11A depicts a schematic side view of an example five layer structure 1402 where the top two layers (L4 and L5) form a relative short cantilever structure 1404 where the length of the cantilever LC is less than a target length TL and where the height of the cantilever is within a target height (i.e. less than a target height) and where the target length sets a minimum cantilever length beyond which the cantilever may particularly benefit from implementation of a curvature reduction technique and wherein target height sets a level beyond which a cantilever structure does not require implementation of a curvature reduction technique.

Figure 11B:
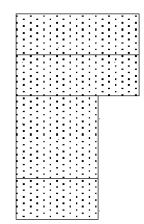

FIG. 11B depicts a schematic side view of the structure of FIG. 11A where no distinction is made between different portions of any of layers L1-L5 because the structure didn't meet both the thinness and length requirements indicated in FIG. 11A. In alternative examples, special distinction may have been granted if only one of the criteria were met.

Figure 12A:
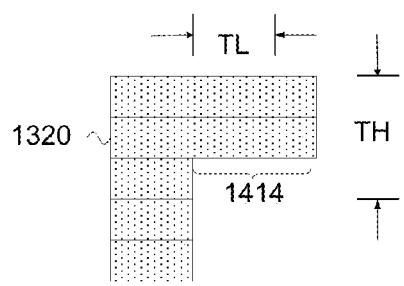

FIG. 12A depicts a schematic side view of an example five layer L1-L5 structure 1412 where the top two layers L4 & L5 form a cantilever structure 1414 whose length exceed a target length and whose thickness is within a minimum height range such that the cantilever portion may be subject to excessive curvature upon standard formation and thus may benefit from application of special formation techniques to help reduce curvature.

Figure 12B:
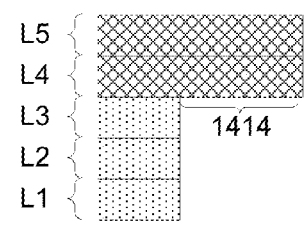

FIG. 12B depicts a schematic side view of the structure of FIG. 12A where the two layers L4 & L5 forming the thin and long cantilever 1414 are shown as being defined differently than the first three layers L1-L3 such that the difference may be used to drive structure formation, according to one or more embodiments of the invention, to help minimize distortion.

FIGS. 13A-14B provide side views of cantilever structures supported from both ends where length and thickness requirements are specified for special identification or where layers of structural material are distinguished depending on whether or not they meet the identification requirements.

FIG. 13A depicts a schematic side view of an example five layer L1-L5 structure 1422 where the structural material of top two layers L4 & L5 form a relative short unsupported central bridge 1424 that is supported on each end by structural material of the third layer L3 where the length of the unsupported region is less than twice cantilever target length TL and where the height of the unsupported portion is within a target height TH and where the target length sets a minimum cantilever length (length from each side) beyond which the unsupported portion may benefit from implementation of a curvature reduction technique and wherein target height sets a level beyond which a cantilever structure does not require implementation of a curvature reduction technique.

FIG. 13B depicts a schematic side view of the structure 1422 of FIG. 13A where no distinction is made between different portions of any layers because the structure didn't meet both the thinness and length requirements indicated in FIG. 13A.

FIG. 14A depicts a schematic side view of an example five layer L1-L5 structure 1432 where the top two layers L4 & L5 form an unsupported central bridge 1434 portion where length of the bridge portion from each end exceeds a target cantilever length TL and whose thickness is within a minimum height range TH such that the cantilever portion 1434 may be subject to excessive curvature upon standard formation and thus may benefit from application of special formation techniques to help reduce curvature.

FIG. 14B depicts a schematic side view of the structure 1432 of FIG. 14A where the two layers L4 and L5 forming the thin but long bridge portion 1434 are shown as being defined differently than the first three layers L1-L3 such that the difference may be used to drive structure formation, according to one or more embodiments of the invention, to help minimize distortion.

Groups and Primary Embodiments

The disclosure of the present invention provides six groups of embodiments which are further broken into a total of eleven primary embodiments for reducing stress or curvature distortion. Though the embodiments present herein are focused on forming multi-layer three-dimensional structures, some of them have application to forming single layer structures with less stress and/or less curvature.

Figure 15A:
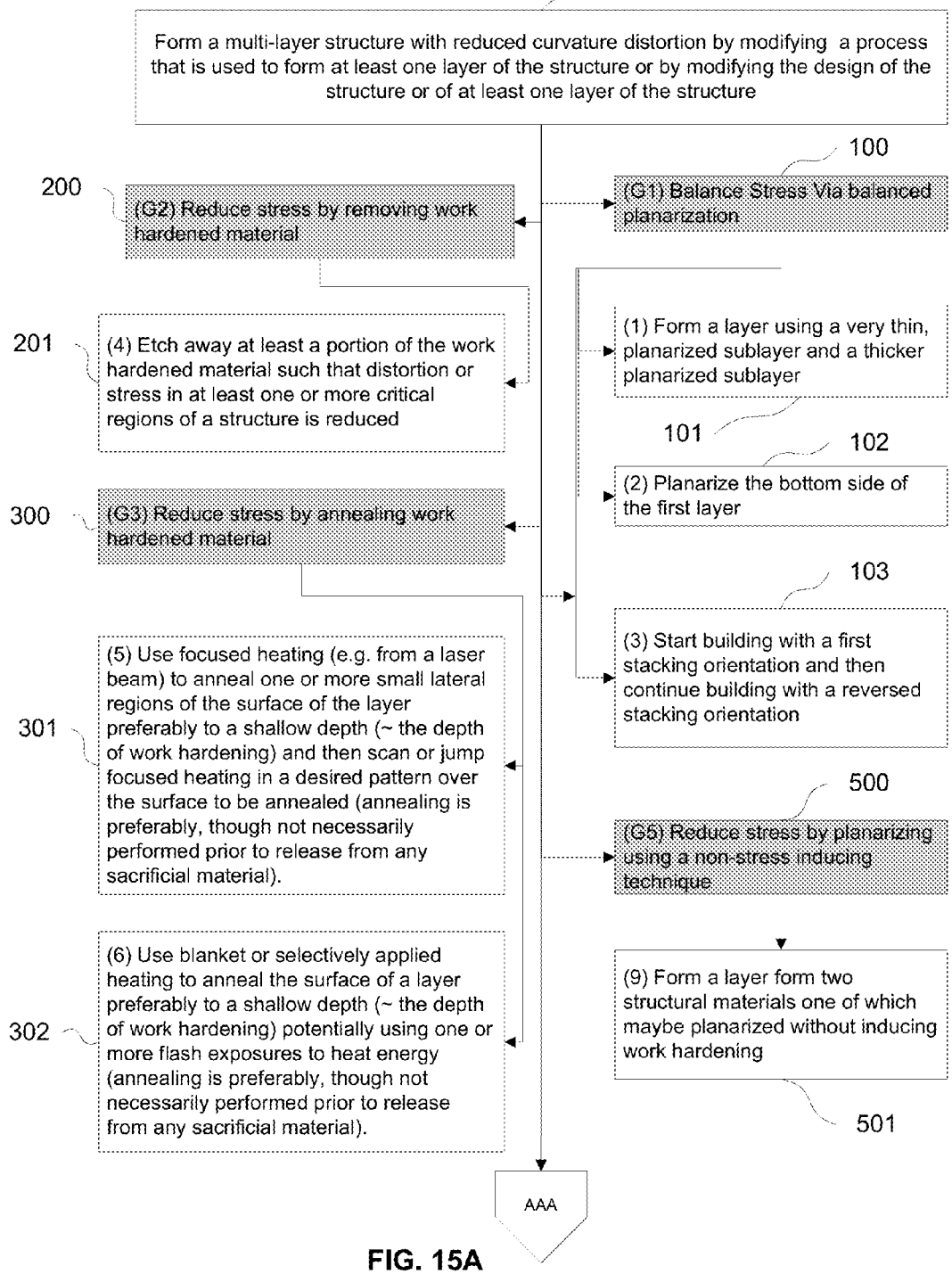
FIGS. 15A and 15B provide a block diagram setting forth a brief description of each of the six groups of embodiments and each of the eleven primary embodiments set forth herein.
Figure 15B:
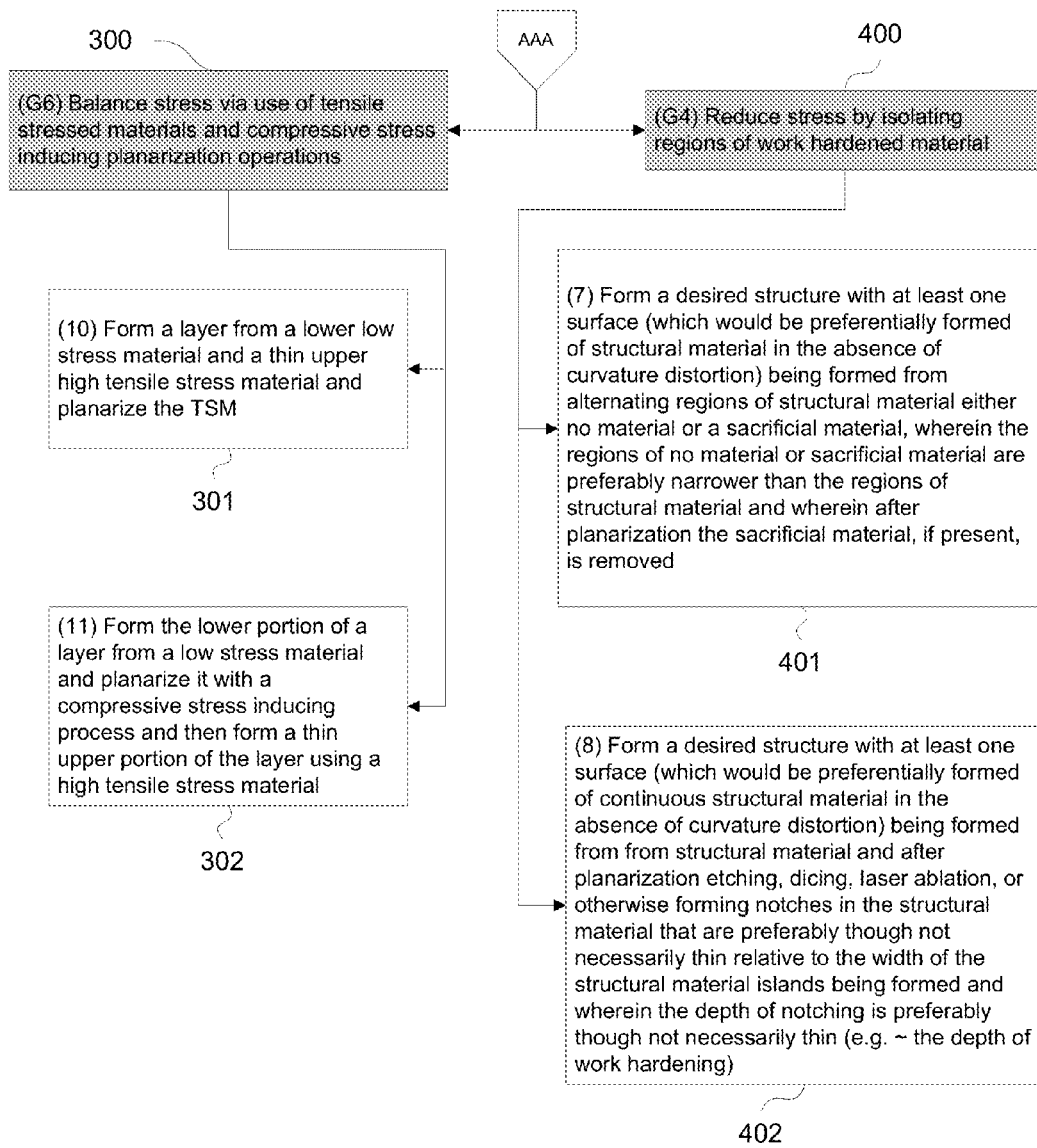

FIGS. 15A and 15B provide a block diagram setting forth a brief description of the eleven primary embodiments set forth herein.

The primary embodiments 99 of the present invention form multi-layer structures with reduced curvature distortion by modifying a process that is used to form at least one layer of the structure or by modifying the design of the structure or of at least one layer of the structure. The first group of embodiments 100 (i.e. Group 1) involves the balancing of stress via creative use of planarization. This group of embodiments includes: (1) a first embodiment 101 that includes formation of at least one layer of the structure that includes a very thin, planarized sub-layer and a thicker planarized sublayer; (2) a second embodiment 102 that includes planarization of the bottom surface of the first layer, and (3) a third embodiment 103 that starts formation of the multi-layer structure by stacking layers using a building axis with a first orientation and then continuing the formation with the orientation of the building axis reversed.

The first embodiment 101 involves the following operations or steps: (1) Determining the critical layers of a structure (e.g. the bottom of the structure, layers including extended down-facing regions, etc.) and (2) forming each critical layer as two sublayers. The first sublayer for each layer has a thickness approximating that of the work hardening depth of the planarization operation so that it becomes substantially compressively stressed. The second sublayer is thicker so that only its upper portion is compressively stressed via planarization. The use of these two sublayers results in a build layer, as a whole, having more balanced stress and thus preferably having less distortion or curvature.

The second embodiment 102 involves the formation of a structure by stacking layers one above one another and planarizing the top of each layer including the potential of inducing stress in each layer. For example, some planarization operations may include the lapping of both sacrificial and structural materials that form the layer. After formation of one or more layers, (e.g. via lapping) and after formation of one or more layers, planarizing the bottom of the first layer using an appropriate technique to induce a balancing stress therein (e.g. via lapping).

The third embodiment 103 involves forming a structure by stacking successive layers one above one another. Starting with the first layer, the top of each of plurality of layers is planarized with stress being induced into each. Planarizing, for example, may occur via lapping. After formation of one or more layers, the orientation of the build axis is reversed and the formation of the structure is continued by adding one or more additional layers to the bottom side of the first layer. During the formation of these additional layers, the top side of one or more of the additional layers is planarized. With respect to the original orientation, the bottom side of the additional layers is planarized.

The second group of embodiments 200 includes the reduction of stress in one or more layers of a structure by removal of worked hardened material. This group of embodiments includes a fourth embodiment 201 that involves etching away at least a portion of any work hardened material and possibly depositing additional material to partially or completely fill any void crated by the etching.

The fourth embodiment 201 includes forming structures by depositing materials, planarizing the materials, and etching back at least one of the materials. The etching back may, for example, be performed with either wet etching or dry etching. Wet etching may be performed chemically or in some circumstances electrochemically. Dry etching may be isotropic or anisotropic. If anisotropic, dry etching may be performed without a mask assuming both structural and sacrificial materials are etched at a reasonably uniform rate. The etching may be performed in a variety of alternative manners, for example: (1) masks may be used if structural material is being etched and if sacrificial material will be damaged by etchant, (2) masks may use "smaller" openings for etching if edge placement is critical and if etchant attacks the sacrificial material, (3) etching may be applied to only those portions of structural material that are non-up-facing surfaces of the structure, (4) etching may be applied to regions that are non-up-facing and that are inset from sidewalls and up-facing regions by an "offset" amount, and/or 5) etching may be applied only to regions whose net thickness (i.e. thickness between up-facing and down-facing regions) is less than a cut off amount which may be a fixed amount or a variable amount based on length of the region, whether the regions is supported from only one side or opposite sides, the thickness of the region etc. Additional operations or steps may be optionally performed, for example: (1) material may be re-deposited to non-up-facing regions during formation of the next layer, (2) material may be re-deposited to up-facing regions if etching was uniform enough and if re-deposition can occur in a uniform enough manner, (3) it may be possible to use a combination of alternating etching and plating to remove the stressed material and re-deposit a material having less stressed.

The third group of embodiments 300 involves the removal of stress without the removal of the work hardened material. This group of embodiments includes: (1) a fifth embodiment 301 involving the use of focused heating to anneal work hardened material and a (2) sixth embodiment 302 involving the use of blanket or selective heating to anneal work hardened material.

The fifth embodiment 301 includes the use of focused heating (e.g. from a laser beam) to anneal one or more small lateral regions of the surface of the layer preferably to a shallow depth (e.g. ~the depth of work hardening) and then scanning or jumping the focused heating in a desired pattern over the surface to be annealed. In this embodiment the annealing is preferably, though not necessarily performed prior to release from any sacrificial material. In this embodiment, the annealing may occur over only a selected portion of the structural material of the layer (e.g. the portion that is part of a thin, e.g. less than 50-100 um, structural thickness), over all of the structural material of the layer, or even over both structural and sacrificial material regions. The annealing of this embodiment preferably occurs after planarization of the layer is completed. However, if sufficient heat is applied annealing of work hardened material on the previously formed layer may occur.

The sixth embodiment 302 includes the use of blanket or selectively applied heating to anneal the surface of a layer preferably to a shallow depth (e.g. ~the depth of work hardening) potentially using one or more flash exposures of heat energy. In this embodiment annealing is preferably, though not necessarily, performed prior to release from any sacrificial material. Selective application may include heating of desired structural material regions, heating of all structural material regions, or heating of selected structural and sacrificial material regions. The annealing of this embodiment preferably occurs after planarization of the layer is completed. However, if sufficient heat is applied annealing of work hardened material on the previously formed layer may occur.

The fourth group of embodiments 400 involves the reduction of stress via the isolation of stress. This group of embodiments includes (1) a seventh embodiment 401 involving modifying the structure by inserting breaks into what would otherwise be contiguous regions of work hardened structural material and (2) an eighth embodiment 402 involves modifying the structure by removing selected regions of work hardened material.

The seventh embodiment 401 includes forming a desired structure with at least one surface (which would be preferentially formed of structural material in the absence of undesired stress and/or curvature distortion) being formed from alternating regions of structural material with either no material or with sacrificial material, wherein the regions of no material or sacrificial material are preferably narrower than the regions of structural material and wherein after planarization the sacrificial material, if present, is removed.

The eighth embodiment 402 includes forming a desired structure with at least one surface (which would be preferentially formed of continuous structural material in the absence of undesired stress and/or curvature distortion) being formed from structural material and after planarization etching, dicing, laser ablation, or otherwise forming notches in the structural material that are preferably though not necessarily thin relative to the width of the structural material islands being formed and wherein the depth of notching is preferably, though not necessarily, thin (e.g. ~the depth of work hardening)

The fifth group of embodiments 500 involves reducing the stress by planarizing using a non-stress inducing technique or a technique. This group includes a ninth embodiment 501 involving formation of a layer from two structural materials one of which is subject to planarization and may be planarized without inducing work hardening.

The ninth embodiment 501 includes formation of a layer of a structure where first structural material deposited is low stress (compressive or tensile) and where second structural material deposited is low stress and is planarizable by a low or non-stress inducing method (e.g. diamond turning or fly cutting) and where low or non-stress inducing planarization of the second material occurs leaving a layer having reduced stress.

The sixth group of embodiments 600 involves reducing stress in a build layer which is formed using different materials having different stress levels after deposition and planarizing one of them. This group of embodiments includes: (1) a tenth embodiment 601 involving forming a build layer using a low stress material and a tensile stress material (TSM), & planarizing the TSM and (2) an eleventh embodiment 602 involving forming a build layer that deposition of a low stress material, planarization of the low stress material followed by deposition of a relatively thin TSM.

The tenth embodiment 601 includes formation of a build layer of a structure where a first structural material deposited is low stress (compressive or tensile) and where second structural material deposited is higher tensile stress and where the layer is planarized through the higher tensile stress material such that compressive stresses induced by planarization are at least partially balanced so that stress and/or curvature is reduced.

The eleventh embodiment 602 includes formation of a build layer of a structure where a first structural material deposited is low stress (compressive or tensile) and where the planarization sets the height of the material at somewhat less than the desired layer thickness or layer level and where compressive stress induced by planarization occurs and thereafter a thin high tensile stress material is deposited to at least partially balance the compressive stress and bring the thickness to the layer thickness or the upper surface of the layer to the desired layer level.

Figure 16:
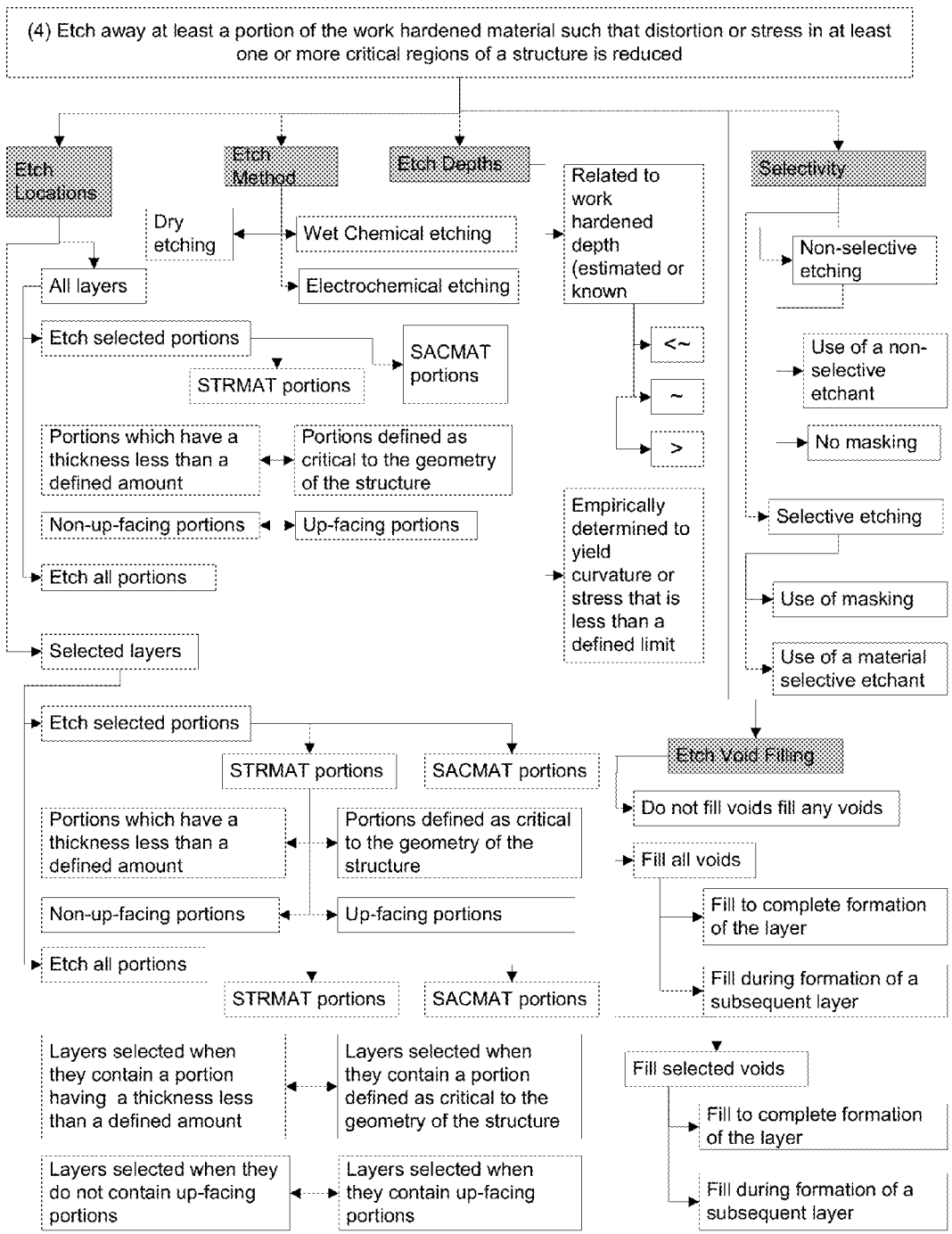
FIG. 16 provide block diagram setting forth examples of options associated with the fourth embodiment of the invention.

FIG. 16 provides a block diagram setting forth examples of options associated with the fourth embodiment of the invention. Similar options exist for the other embodiments of the invention.

An Implementation of the First Preferred Embodiment and Some Alternatives

Figure 17A:
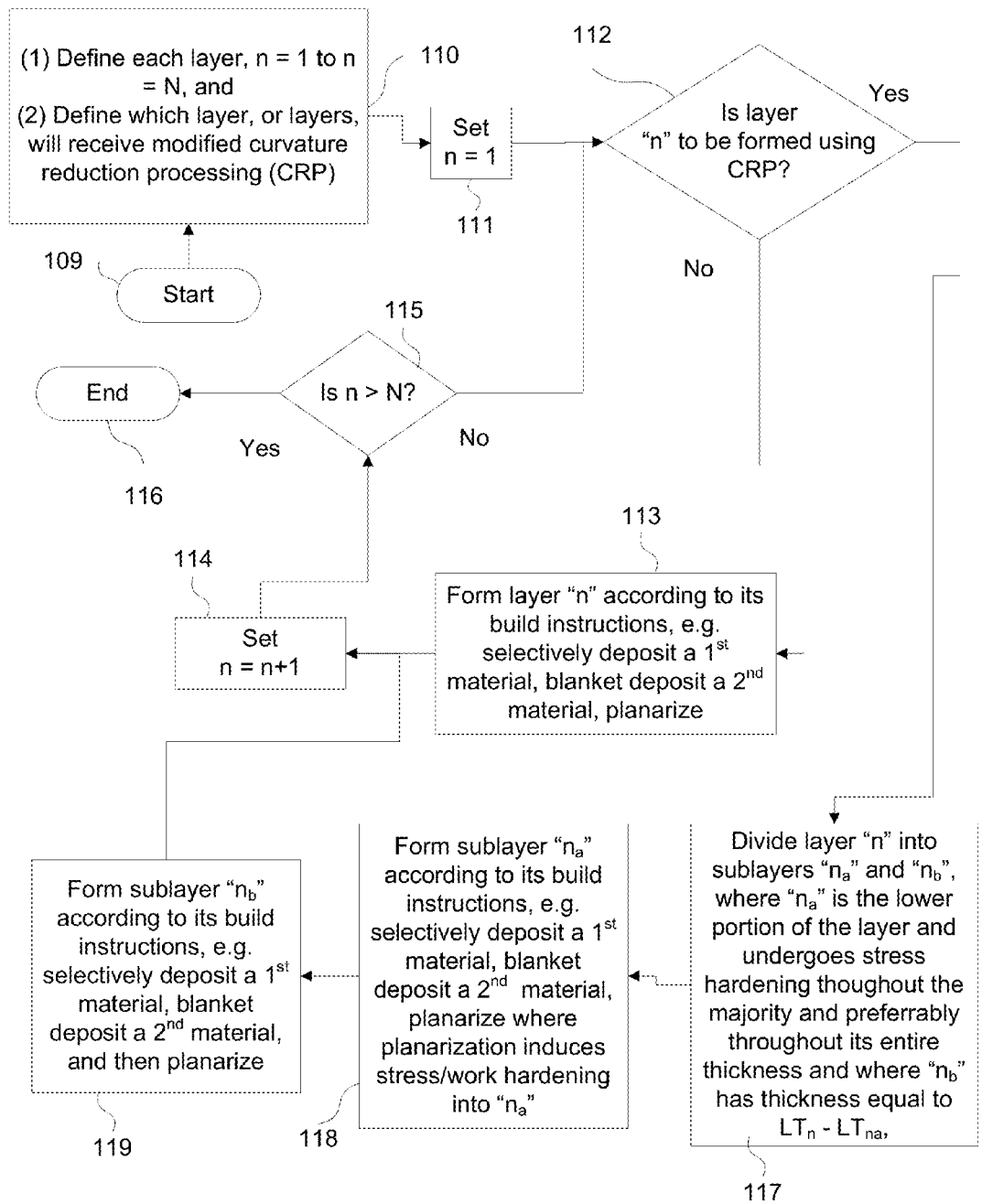
FIG. 17A provides a generalized flowchart of a first embodiment of invention where the process of forming at least one layer of the structure is modified to reduced curvature by forming the at least one layer from a first sublayer having a thickness that is less than or equal to work hardening thickness and a second sublayer that has a thickness that is the layer thickness minus the thickness of the first sublayer.

FIG. 17A provides a generalized flowchart of a first embodiment of invention where either (1) the process of forming at least one layer of the structure is modified to reduced curvature by forming the at least one layer from a first sublayer having a thickness that is less than or equal to work hardening thickness and a second sublayer that has a thickness that is the layer thickness minus the thickness of the first sublayer, or (2) the data descriptive of the three-dimensional structure or of cross-sections of the three-dimensional structure are analyzed to determine if certain criteria are met, such as those exemplified in FIGS. 11D-11M to determine if the curvature reduction process technique of the current process should be used.

The process start with block 109 and proceeds to block 110 which calls for defining the layers n=1 to N which are required to fabricate a desired structure or structures and which calls for defining which layers of the structure will receive modified processing for curvature of stress reduction (i.e. which layers will be processed using curvature reduction processing or CRP). Block 111 set the value of the layer number variable "n" equal to one. Block 112 enquires as to whether or not the current layer "n" will be formed using CRP. If response is "no", the process moves to block 113 which calls for the formation of layer "n" using a desired formation process (i.e. one that may not be tailored to reduce curvature or stress). After formation of layer "n" the process moves forward to block 114 which increments the layer number variable "n" by one (i.e. n=n+1). After block 114 the process moves to the enquiry of block 115 which enquires as to whether n>N, where N is the number of the final layer to be formed. If the answer is "yes" the process moves to block 116 and ends otherwise it loops back to block 112.

If the answer to the enquiry of block 112, for the current layer is "yes" the process moves forward to blocks 117, 118, and 119 to implement the curvature reduction technique of this embodiment. Block 117, calls for the division of layer "n" into sublayers "$n_a$" and "$n_b$" where "$n_a$" defines the lower portion of layer "n" and represents a thin layer that can be made to undergo work hardening (e.g. via planarization) through the majority, if not all, of its thickness while sublayer "$n_b$" defines the majority of the thickness of layer "n". In alternative embodiments, the data manipulations of block 117 may be performed prior to the initiation of any physical formation of the structure. From block 117 the process moves forward to block 118 which calls for the formation of sublayer "na" according to its build instructions where deposited materials will be planarized to set the height of sublayer "$n_a$" equal to the desired height and where the planarization will cause stress and/or work hardening of the sub layer "$n_a$." through most if not all of its thickness.

After completion of sublayer "$n_a$.", the process moves forward to block 119 which calls for the formation of sublayer "$n_b$" where the planarization process used only work hardens a portion of the thickness of sublayer "$n_b$". In effect, this process results in the work hardening or stressing of both the bottom and top of layer "n" which should help balance the stress induced in the layer and help reduce an net stress that would lead to curvature of the layer. From step 119 the process loops back to block 114. The process is then continued until all layers 1 to N of the structure are formed.

Figure 17B:
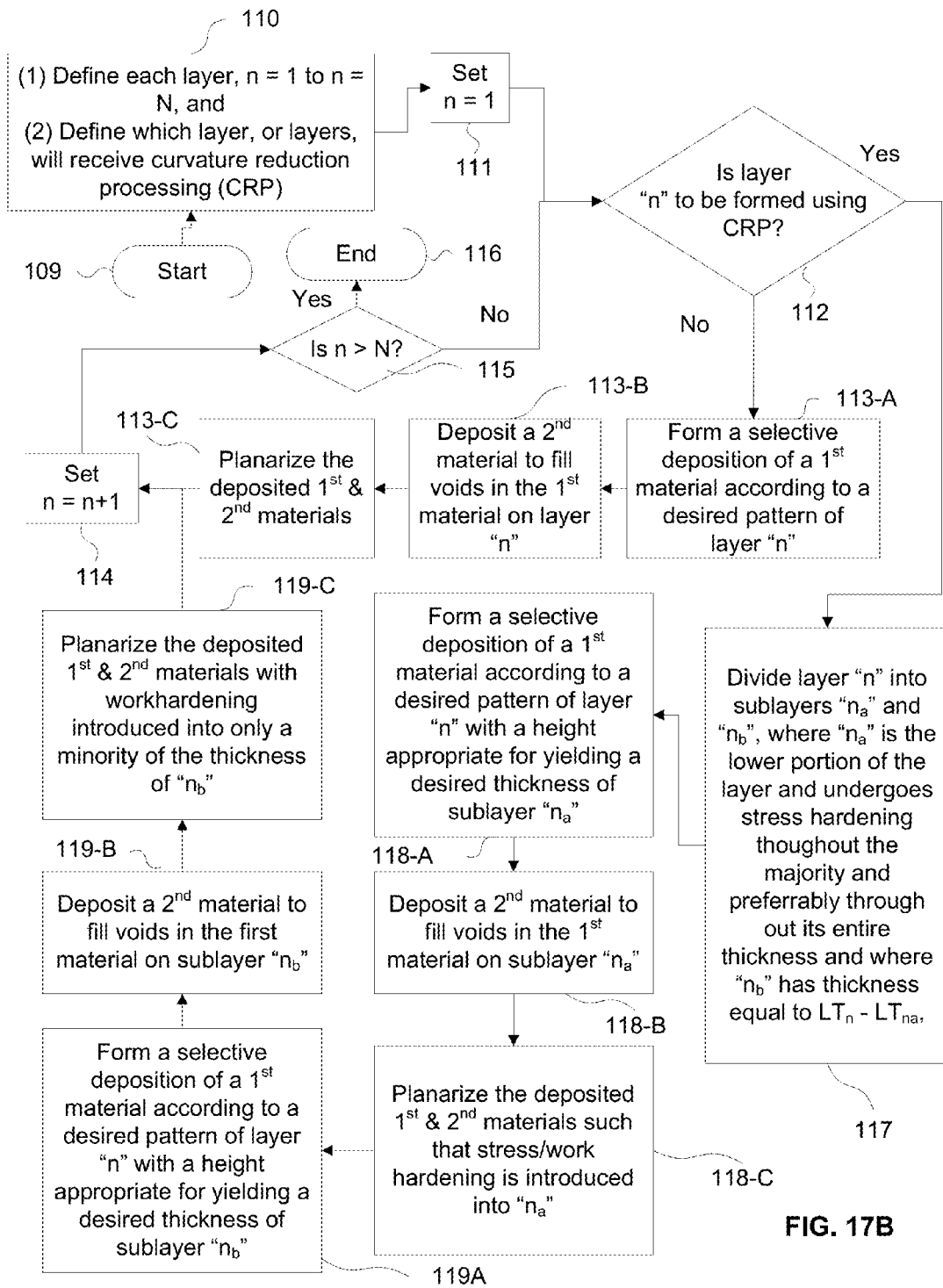
FIG. 17B provides a more specific set of steps or operations for a specific implementation of the first embodiment of the invention.

FIG. 17B provides a more specific set of steps or operations for a specific implementation of the first embodiment of the invention. In this more implementation, blocks that are similar to those in FIG. 17A are similarly labeled. In this more specific embodiments the steps 113, 118, and 119 are further defined to include steps of operations 113-A to 113-C, 118-A to 118-C, and 119-A to 119-C, respectively.

Step 113-A calls for the selectively depositing a first material according to a desired pattern of layer "n", step 113-B calls for depositing a second material to fill voids in the 1st material on layer "n", while step calls for planarizing the deposited first and second materials. In the present embodiment, these steps complete the formation of layer "n". Typically one of the first material or the second material is a sacrificial material while the other is a structural material. In other embodiments, different operations/steps may be used in forming layers.

Step 118-A calls for forming selectively depositing a first material according to a desired pattern of layer "n" with a height appropriate for yielding a desired thickness of sublayer "$n_a$", step 118-B calls for depositing a second material to fill voids in the first material on sublayer "$n_a$", and step 118-C calls for planarizing the deposited first and second materials such that stress/work hardening is introduced into "$n_a$". In the present embodiment, these steps complete the formation of sublayer "$n_a$". Typically one of the first material or the second material is a sacrificial material while the other is a structural material. In other embodiments, different operations/steps may be used in forming sublayer "$n_a$".

Step 119-A calls for selectively depositing a first material according to a desired pattern of layer "n" with a height appropriate for yielding a desired thickness of sublayer "$n_b$", step 119-B calls for depositing a second material to fill voids in the first material on sublayer "$n_b$", and Step 119-C calls for planarizing the deposited first and second materials with work hardening introduced into only a minority of the thickness of "$n_b$". In the present embodiment, these steps complete the formation of sublayer "$n_b$". Typically one of the first material or the second material is a sacrificial material while the other is a structural material. In other embodiments, different operations/steps may be used in forming sublayer "$n_b$".

Figures 1, 17C:
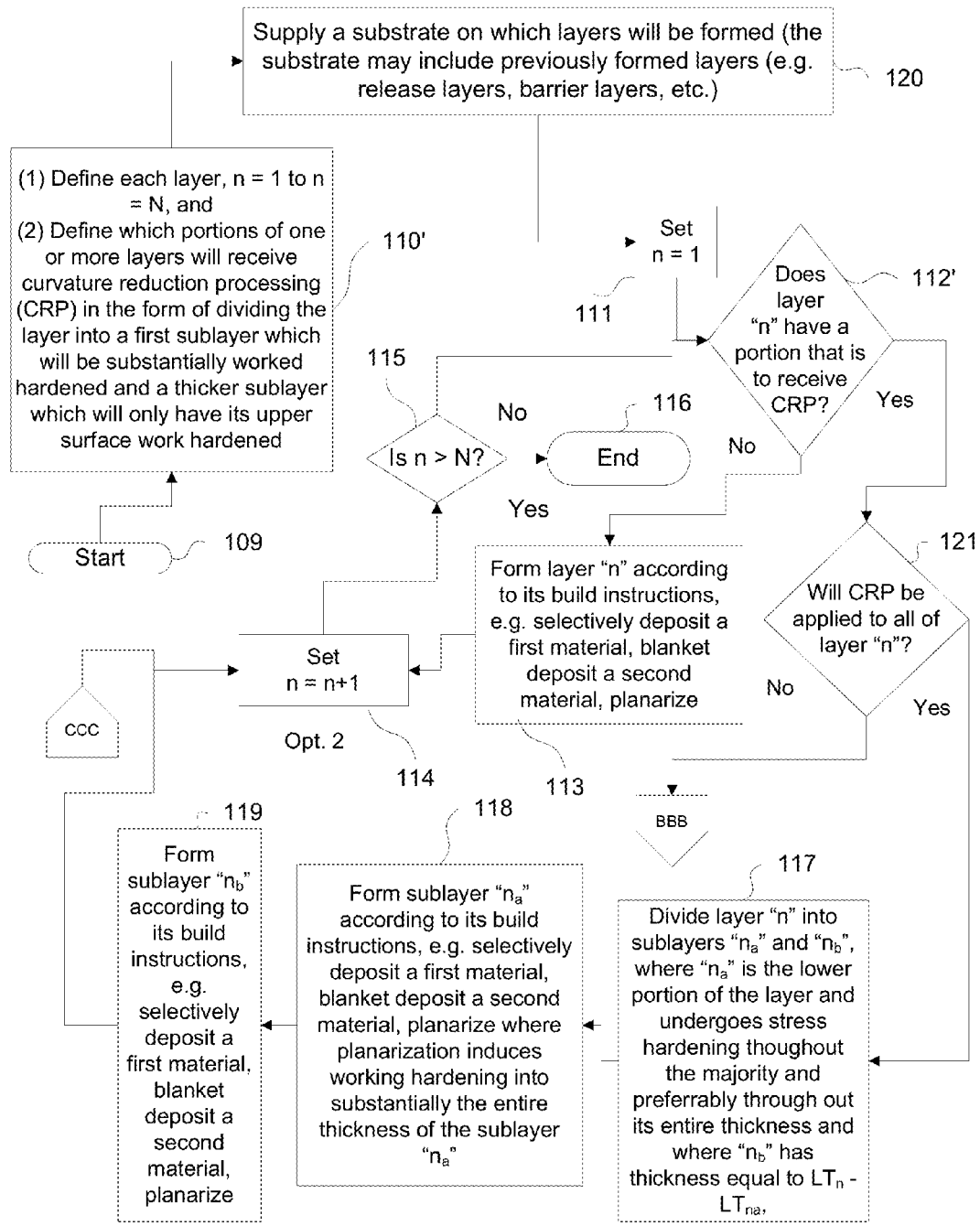
Figures 2, 17C:
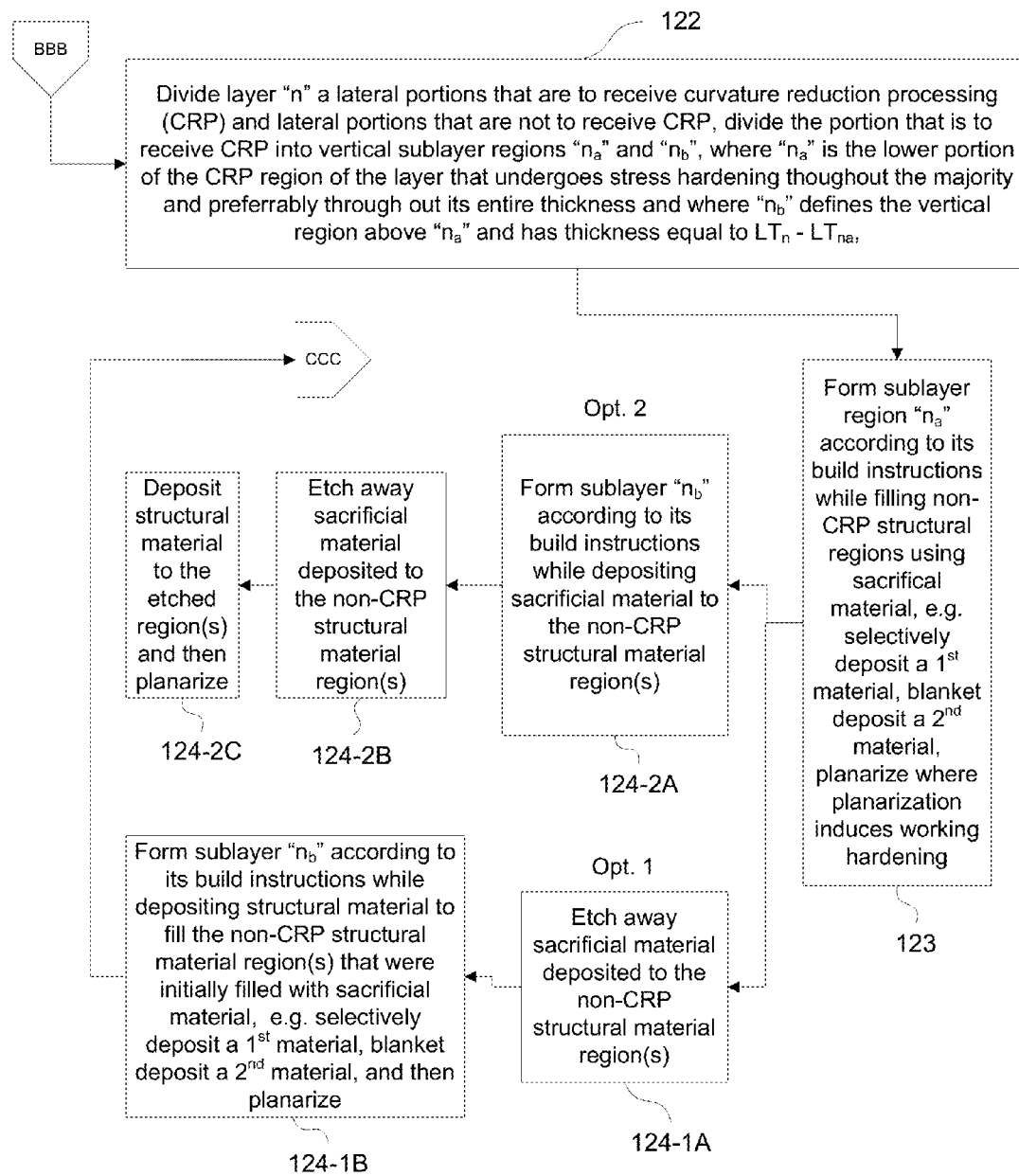

FIGS. 17C-1-17C-2 provide a variation of the first embodiment of the invention where the curvature reduction technique may be applied to only selected lateral portions of layers as opposed to the entire layers and where two optional branches of the process are illustrated. In this alternative implementation, blocks that are similar to those in FIG. 17A are similarly labeled. In alternative embodiment, step 110 is modified to become step 110' as one does not simply define which layers will receive CRP but instead individual portions of layers are defined to receive CRP. Step 120 is inserted between 110' and 111 and calls for the supplying of a substrate on which to form layers. The enquiry of step 112 is modified to become the enquiry of step 112' as the question is posed as to whether or not layer "n" has portion that is to receive CRP. If the answer to the enquiry of step 112' is "yes" the process move forward to block 121 which enquires as to whether CRP will be applied to all of the layer "n". If the answer is yes the process moves forward to blocks 117-119 and back to 114, as previously discussed with regard to FIG. 17A. If the answer is "no" the process moves forward to the process moves forward to block 122. Block 122 calls for the dividing of layer "n" into lateral portions that are to receive curvature reduction processing (CRP) and lateral portions that are not to receive CRP. It also calls for dividing the portion that is to receive CRP into vertical sublayer regions "$n_a$" and "$n_b$", where "$n_a$" is the lower portion of a CRP region of the layer that undergoes stress hardening throughout the majority, and preferably throughout, its entire thickness and where "$n_b$" defines a vertical region above "$n_a$" and has thickness equal to $LT_n - LT_{na}$. From Block 122 the process moves forward to block 123.

Block 123 calls for forming a sublayer region "$n_a$" according to its build instructions while filling non-CRP structural regions using sacrificial material, e.g. by selectively depositing a first material, blanket depositing a second material, and planarizing the materials where the planarization induces work hardening.

From Block 123 the process moves forward to either block 124-1A or 124-2A depending on whether a first option is chosen or a second option. Block 124-1A calls for etching away sacrificial material deposited to the non-CRP structural material region(s). This etching may be formed selective after masking has occurred. After block 124-1A, the process moves to block 124-B which calls for forming sublayer "$n_b$" according to its build instructions while depositing structural material to fill the non-CRP structural material region(s) that were initially filled with sacrificial material, e.g. by selectively depositing a first material, blanket depositing $2^{nd}$ material, and then planarizing. As noted above the second option takes the process to block 124-2A which calls for forming sublayer "$n_b$" according to its build instructions while depositing sacrificial material to the non-CRP structural material region(s) and thereafter moving to block 124-2B which calls for the etching away of sacrificial material deposited to the non-CRP structural material region(s) from both the "$n_a$" and "$n_b$" portions of layer "n" after which the process moves forward to block 124-2C which calls for depositing structural material to the etched region(s) and then planarizing.

FIGS. 18A-18I depict various states of an implementation of the first embodiment according to the process of FIG. 17B as applied to the formation of the structure of FIG. 6B where CRP is applied to the entire second layer of the structure.

Figure 18A:
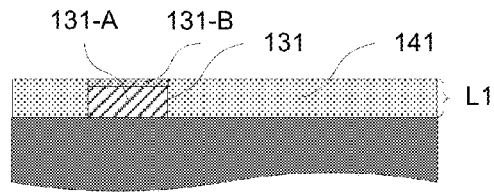
FIGS. 18A-18I depict various states of an implementation of the first embodiment according to the process of FIG. 17B as applied to the formation of the structure of FIG. 6B where CRP is applied to the entire second layer of the structure.

FIG. 18A depicts a side view of the state of the process after a first layer L1 is formed using a structural material 131 and a sacrificial material 141 wherein the upper surface portion 131-B of the structural material is shown as being different from the remainder 131-A of the structural material as it has undergone work hardening from a planarization operation that was used to set the level of the first layer.

Figure 18B:
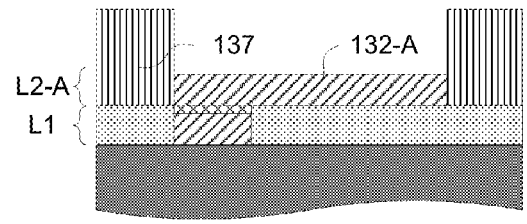
Figure 18C:
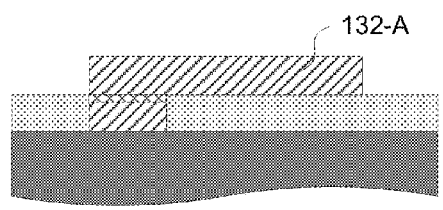
Figure 18D:
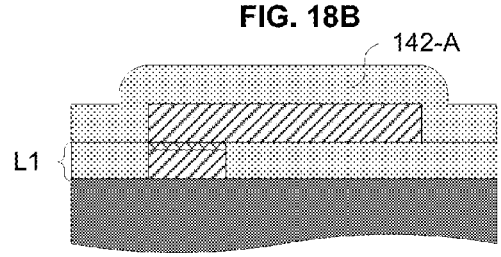
Figure 18E:
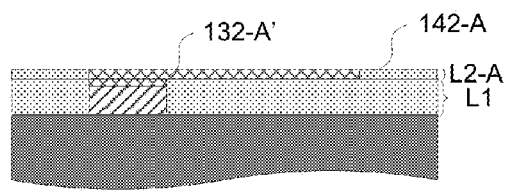

FIGS. 18B-18E depict states of the process involving the formation of the first sublayer of the second layer. FIG. 18B depicts a side view of the state of the process after a mask 137 is applied and patterned and after a structural material 132-A has been deposited as part of forming a first sublayer L2-A of the second layer L2. FIG. 18C depicts a side view of the state of the process after the mask has been removed. FIG. 18D depicts a side view of the state of the process after a blanket deposit of a sacrificial material 142-A has been made as part of the process of forming the first sublayer L2-A of the second layer L2. FIG. 18E depicts a side view of the state of the process after the materials forming the first sublayer L2-A of the second layer L2 have been planarized where it is shown that substantially all of the structural material 132-A' on the first sublayer L2-A of the second layer has undergone work hardening.

Figure 18F:
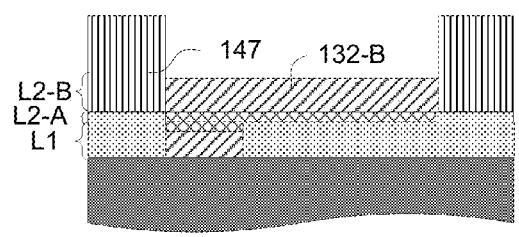
Figure 18G:
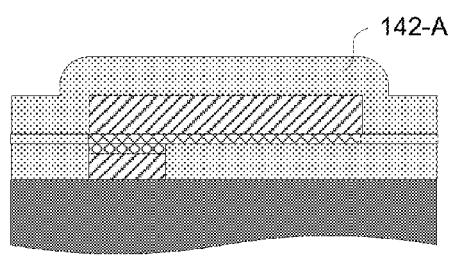
Figure 18H:
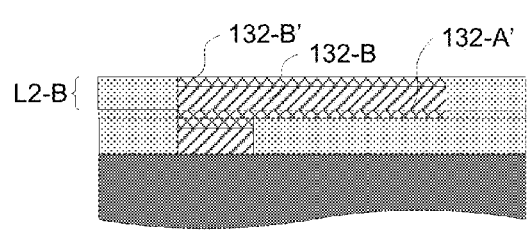

FIGS. 18F-18H depict states of the process involving formation of the second sublayer of the second layer. FIG. 18F depicts a side view of the state of the process after a mask 147 is applied and patterned and after a structural material 132-B has been deposited as part of forming a second sublayer L2-B of the second layer L2. FIG. 18G depicts a side view of the state of the process after the mask 147 has been removed and a blanket deposit of sacrificial material 142-B has been made as part of the process of forming the second sublayer L2-B of the second layer L2. FIG. 18H depicts a side view of the state of the process after the materials 132-B and 142-B forming the second sublayer L2-B of the second layer L2 have been planarized where it is shown that only the top portion of the structural material 132-B' on the second sublayer of the second layer has undergone work hardening.

Figure 18I:
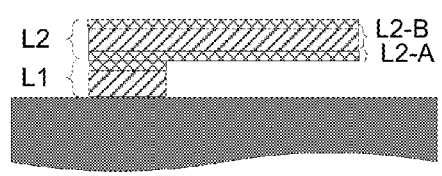

FIG. 18I depicts a side view of the state of the process after the sacrificial material has been removed to release/reveal the structure/device formed. FIG. 18I can be compared to 6C to see the difference in work hardening regions that result from the use of CRP of the present embodiment and which it is believed will lead to a reduction in curvature of the structural material portion of the second layer L2 after it is released from the sacrificial material.

An Implementation of the Second Preferred Embodiment and Some Alternatives

Figure 19:
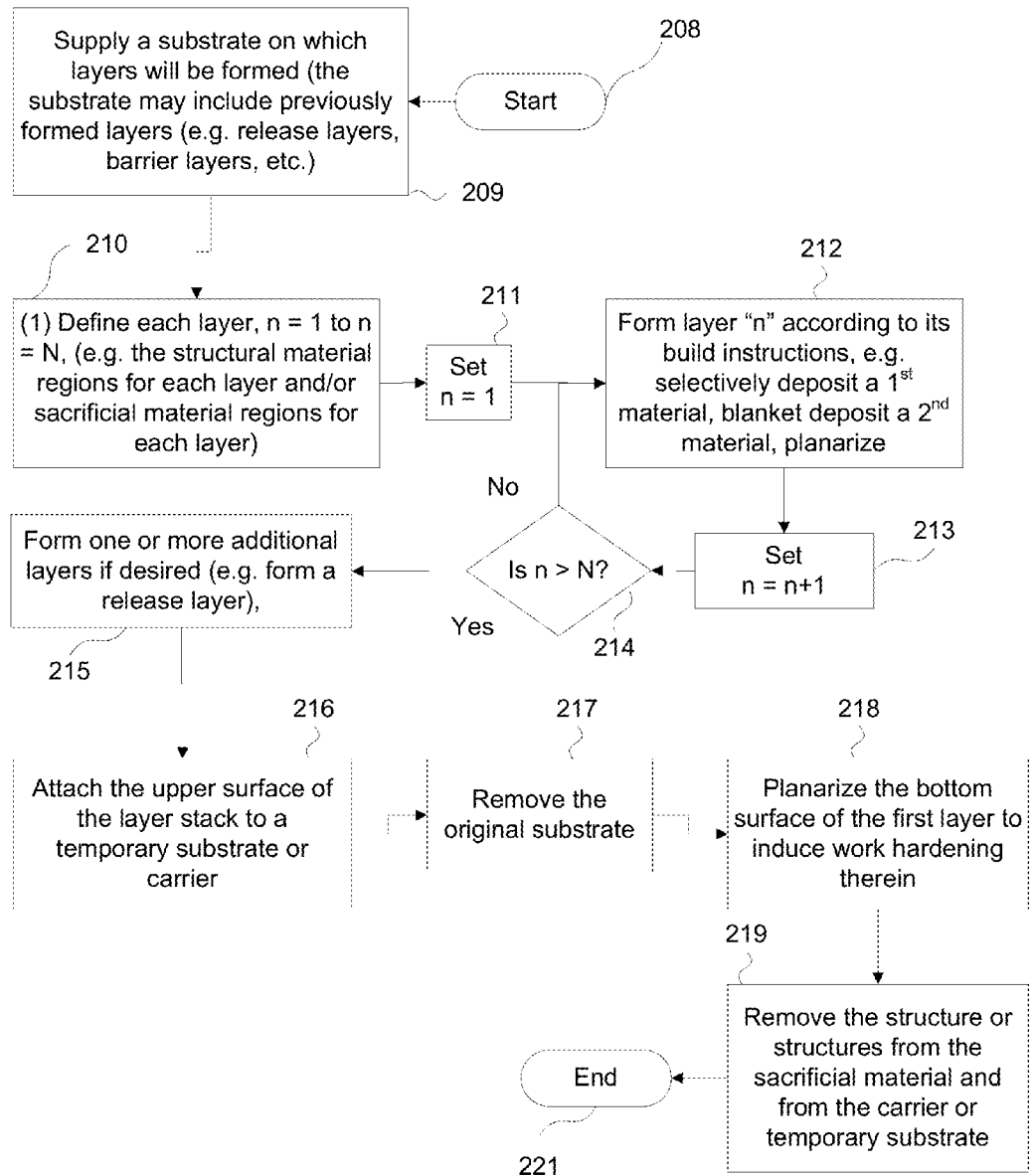
FIG. 19 provides a generalized flowchart of the second embodiment of the invention where the structure will be formed, transferred to a second substrate or carrier, the original substrate or carrier removed and the bottom side of the first layer planarized to induce work hardening therein.

FIG. 19 provides a generalized flowchart for the second embodiment of the invention where the structure will be formed, transferred to a second substrate or carrier, the original substrate or carrier removed and the bottom side of the first layer planarized to induce work hardening therein.

The process of FIG. 19 start with block 208 and then moves to block 209 which calls for supplying a substrate on which layers will be formed. The process then moves to block 210 which calls for the defining of each layer from the first to the Nth from which the structure will be formed. After layers are defined, the process moves forward to block 211 which calls for setting the layer number variable equal to one. Next, with block 212, the "nth" layer is formed according to its build instructions. Next the layer number variable "n" is incremented by one (i.e. per block 213, n=n+1). Next the block 214 makes the enquiry as to whether the layer number variable has exceed the number of the final layer (i.e. has the last layer been formed?). If "no" the process loops back to block 212, if "yes" the process moves forward to block 215. Block 215 calls for the formation of one or more additional layers if desired. Such additional layers may include, for example, a release layer. From block 215 the process moves forward to block 216 which calls for attaching the upper surface of the layer stack (i.e. the upper surface of the last formed layer) to a temporary substrate or carrier). Next, according to block 217, the original substrate is removed. The originally substrate may have been destructively removed or removed via a release layer or the like. Next, according to block 218, the bottom surface of the first layer is planarized in a manner to induce work hardening in it. This is done with the hopes of balancing the stress induced in the upper portion of each layer, by other planarization operations, with the downward stress introduced by this operation. Finally, according to block 220, the structure is separated from the sacrificial material and from the second substrate (if desired) or from the carrier. The process then moves forward to block 221 and ends. It is believed that the structure will have more balanced stress due to the final planarization operation and therefore will have less intended curvature.

Figure 20A:
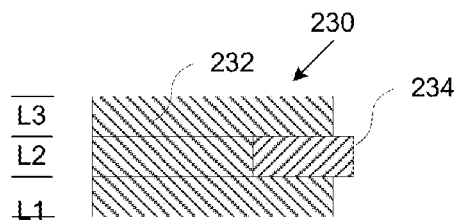
FIG. 20A depicts a side view of a three layer structure made from two different structural materials (e.g. a pin probe formed on its side having a nickel body and a rhodium tip).
Figure 20B:
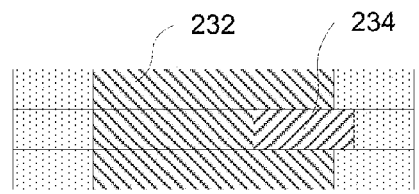
FIG. 20B depicts a side view of the structure of FIG. 20A while still surrounded by sacrificial material.

FIG. 20A depicts a side view of a three layer L1-L3 structure 230 made from two different structural materials 232 and 234 (e.g. a pin probe formed on its side having a nickel or nickel cobalt body 232 and a rhodium tip 234). The structure may be relatively thin 50-60 microns in height, or less, and may be subject to significant unintended curvature when formed by an electrodeposition process as discussed herein and released from sacrificial material and a substrate on which it was formed. FIG. 20B depicts a side view of the structure of FIG. 20A while it is still surrounded by sacrificial material 236.

Figure 20C:
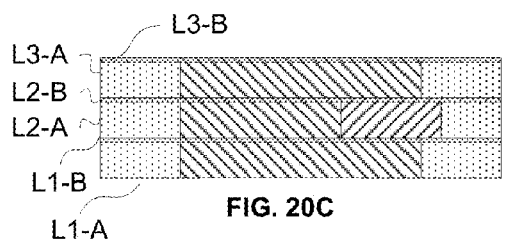
FIG. 20C depicts a side view of the structure of FIG. 20B where work hardened upper portions of each layer are indicated (these portions may result from planarization of each layer, e.g. by lapping, as it is formed).
Figure 20D:
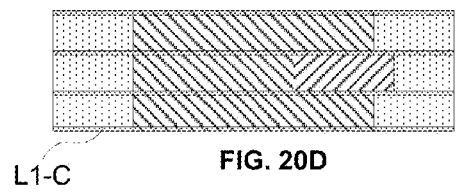
FIG. 20D depicts a side view of the structure of FIG. 20B where work hardened upper portions of each layer are indicated and where the bottom portion of the first layer is shown as worked hardened according to an embodiment of the second embodiment of the invention so as to help balance any stresses (e.g. compressive forces) within the structure that may tend to make the structure curve after release from a build substrate and sacrificial material used in forming the structure.

FIG. 20C depicts a side view of the structure of FIG. 20B where work hardened upper portions of each layer L1-B, L2-B, and L3-B are shown along with regions that did not undergo significant work hardening L1-A, L2-A, L3-A. The work hardened regions may result from planarization of each layer, e.g. by lapping, as it is formed. FIG. 20D depicts a side view of the structure of FIG. 20B where work hardened upper portions of each layer are indicated and where the bottom portion L1-C of the first layer is shown as work hardened according to an implementation of the second embodiment of the invention so as to help balance any stresses (e.g. compressive forces) within the structure that may tend to make the structure curve after release from a build substrate and sacrificial material used in forming the structure.

Figure 21A:
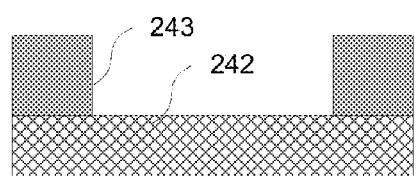
FIGS. 21A-21V provide side views of various states of an example process involved in forming the structure of FIG. 3 according to an embodiment of the invention
Figure 21B:
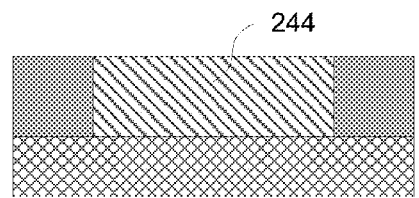
Figure 21C:
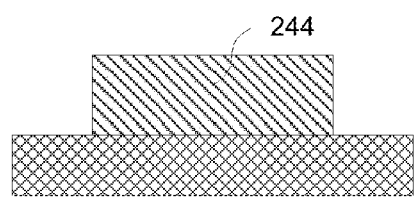
Figure 21D:
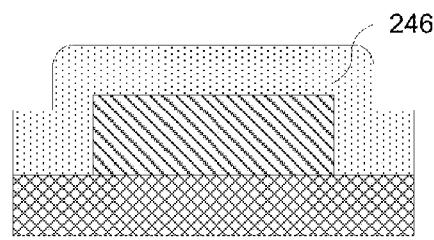
Figure 21E:
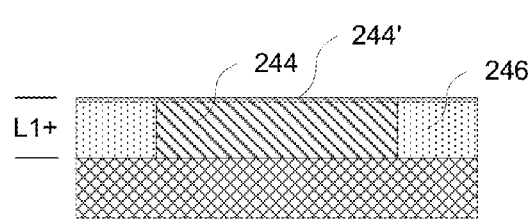
Figure 21F:
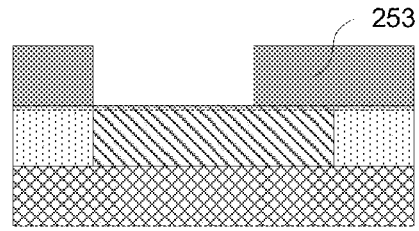
Figure 21G:
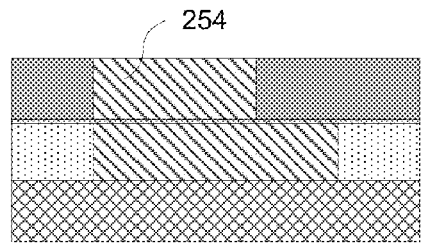
Figure 21H:
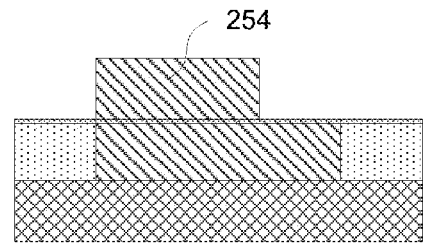
Figure 21I:
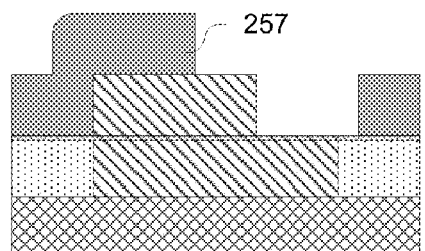
Figure 21J:
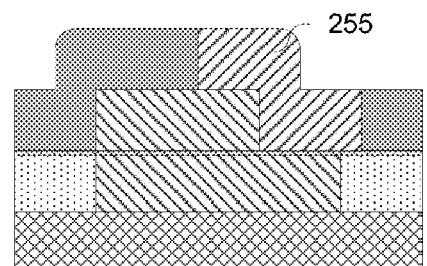
Figure 21K:
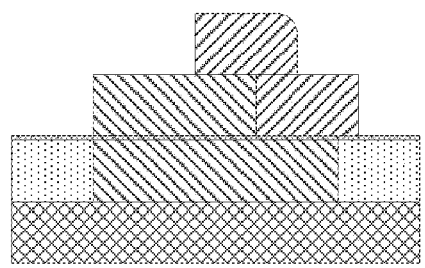
Figure 21L:
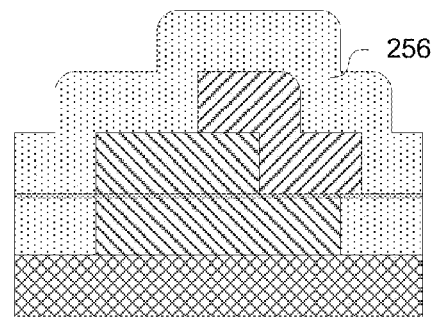
Figure 21M:
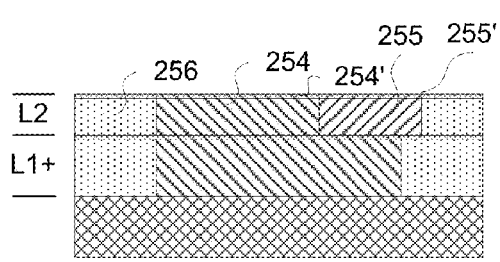
Figure 21N:
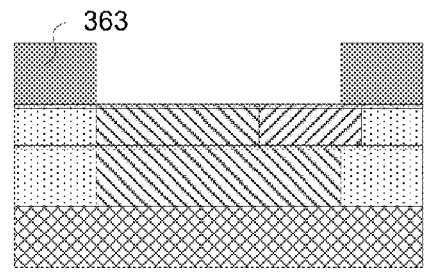
Figure 21O:
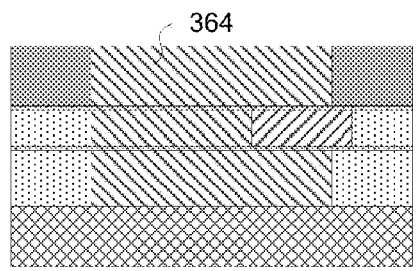
Figure 21P:
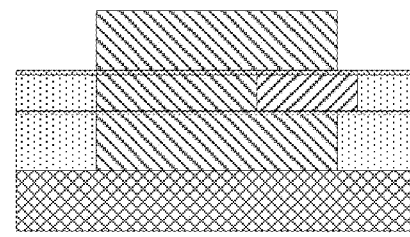
Figure 21Q:
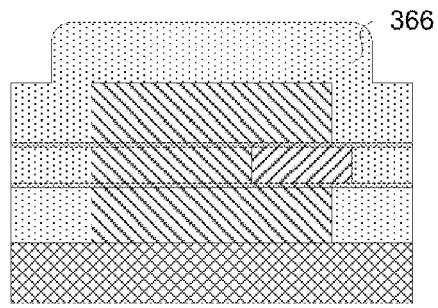
Figure 21R:
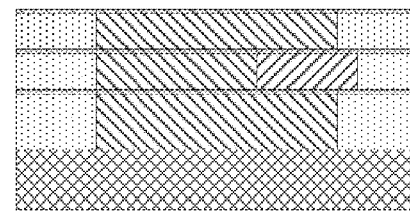
Figure 21S:
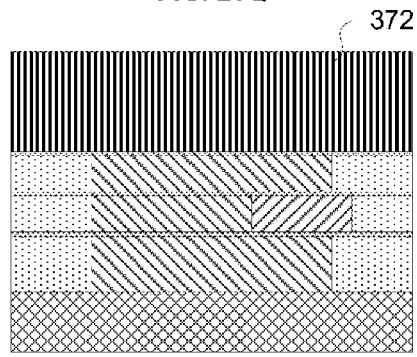
Figure 21T:
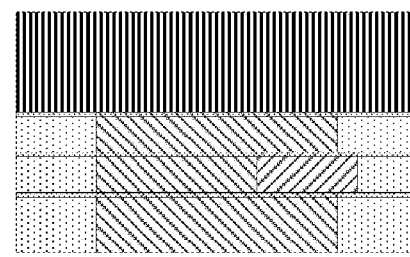
Figure 21U:
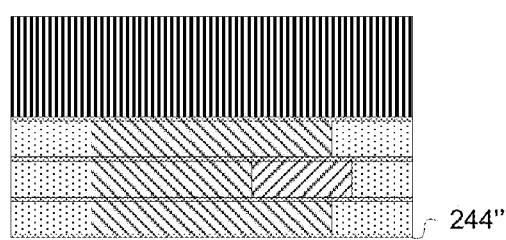
Figure 21V:
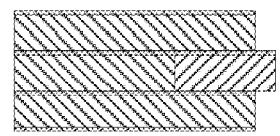

FIGS. 21A-21V provide side views of various states of an example process involved in forming the structure of FIGS. 20A & 20B in an implementation of the second embodiment of the invention. This process falls within process description defined by the flowchart of FIG. 19.

FIGS. 21A-21E depict various states of the process involved in forming a first layer L1 of the structure where the height of the first layer will not be completely finalized until after all layers are formed. FIG. 21A depicts a side view of the state of the process after a photoresist 243 has been patterned deposited onto a substrate 242 in preparation for selectively depositing a 1st structural material during formation of a 1st layer of the structure. FIG. 21B depicts a side view of the state of the process after deposition of the first structural material 244. FIG. 21C depicts a side view of the state of the process after removal of the photoresist 243. FIG. 21D depicts a side view of the state of the process after blanket deposition of a sacrificial material 246 that will form a portion of the 1st layer. FIG. 21E depicts a side view of the state of the process after planarization of the materials deposited on the first layer L1 but where the resulting height of the first layer is greater than a desired final height for the first layer. The upper portion 244' of material 244 is shown differently as it is assumed that it has been work hardened by the planarization process.

FIGS. 21F-21M depict a side view of various states of the process involved informing the second layer L2 of the structure. FIG. 21F depicts a side view of the state of the process after application and patterning of a photoresist 253 in preparation for deposition of a first structural material 254 for the second layer L2. FIG. 21G depicts a side view of the state of the process after deposition of the first structural material 254 associated with the second layer. FIG. 21H depicts a side view of the state of the process after removal of the photoresist 253. FIG. 21I depicts a side view of the state of the process after application and patterning of a second photoresist 257 on the second layer where an opening is created that will allow deposition of a second structural material 255 along side the first structural material 254 (it may also allow some deposition over the first structural material if such patterning is necessary to allow appropriate and reliable exposure and development of the photoresist to occur. FIG. 21J depicts a side view of the state of the process after deposition of the 2nd structural material 255. FIG. 21k depicts a side view of the state of the process after removal of the photoresist 257. FIG. 21L depicts a side view of the state of the process after deposition of sacrificial material 256 which will form a part of the second layer. FIG. 21M depicts a side view of the state of the process after planarization of the three materials deposited to form the second layer where the upper surface 254' and 255' of materials 254 and 255 are indicated as being subjected to work hardening and associated compressive stress and where the height of the second layer is equal to a desired height of the second layer.

FIGS. 21N-21S depict side view of various states of the process associated with forming the third layer L3 of the structure. FIG. 21N depicts a side view of the state of the process after a photoresist 263 is applied and patterned onto the second layer in preparation for selectively depositing a first structural material during formation of a third layer of the structure. FIG. 21O depicts a side view of the state of the process after deposition of the first structural material 364. FIG. 21P depicts a side view of the state of the process after removal of the photoresist 363. FIG. 21Q depicts a side view of the state of the process after blanket deposition of a sacrificial material 366 that will form a portion of the 3rd layer. FIG. 21R depicts a side view of the state of the process after planarization of the materials deposited on the third layer where the resulting height of the 3rd layer is equal to a desired height of the third layer and where the upper portion 364' of the structural material 364 is shown as having been work hardened.

FIG. 21S depicts a side view of the state of the process after attachment of a secondary substrate or carrier 372 (e.g. a vacuum chuck). FIG. 21T depicts a side view of the state of the process after removal of the original substrate 242. In some alternative embodiments there may have been a release material located between the substrate and the first layer so that the substrate may be removed in a nondestructive manner. FIG. 21U depicts a side view of the state of the process after planarization of the bottom side of the first layer thereby providing some balancing compressive work hardening of the structural material 244" on the bottom of the first layer which may tend to reduce the amount of curvature the structure will undergo. FIG. 21V depicts a side view of the state of the process after the structure is released from the sacrificial material and from the secondary substrate or carrier 272.

Figure 22A:
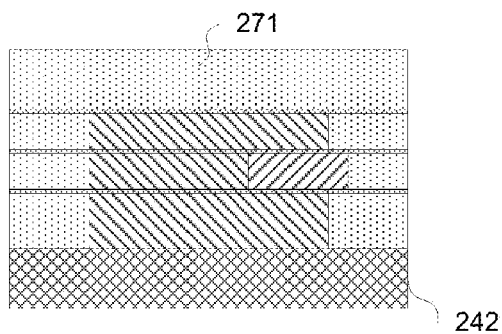
FIG. 22A-22F depict states of the process that may replace states 21S-21V in an alternative embodiment where a release layer and a substrate or other carrier is added to the top of the 3rd layer so that continued operations (e.g. planarization of the bottom of the 1st layer may occur.
Figure 22B:
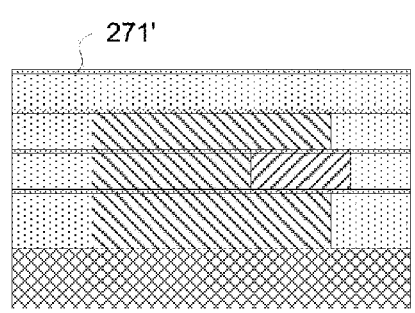
Figure 22C:
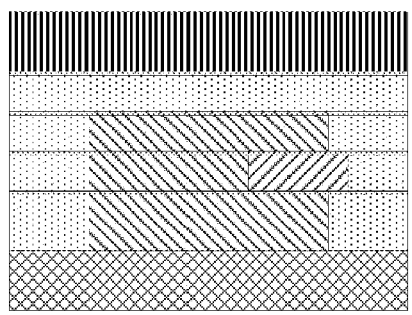
Figure 22D:
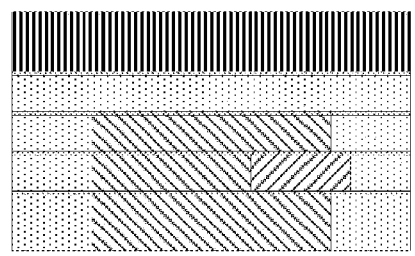
Figure 22E:
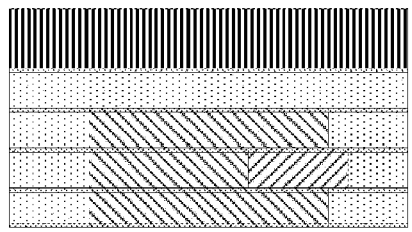
Figure 22F:
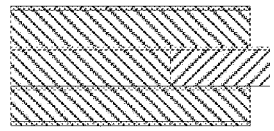

FIG. 22A-22F depict states of the process that may be used to replace states 21S-21V in an alternative implementation of the second embodiment where a release layer and a substrate or other carrier is added to the top of the 3rd layer so that continued operations (e.g. planarization of the bottom of the 1st layer may occur). FIG. 22A depicts the state of the process after a release layer 271 of sacrificial material (this is a one material layer) is deposited on top of the third layer. FIG. 22B depicts the state of the process after the release layer 271 of sacrificial material is planarized with the potential work hardened portion of the release layer is indicated 271'. FIG. 22C depicts the state of the process after a transfer substrate or carrier 272 is bonded or otherwise attached to the release layer 271. FIG. 22D depicts the state of the process after the original substrate 242 is removed. FIG. 22E depicts a side view of the state of the process after planarization of the bottom side of the first layer thereby providing some balancing compressive work hardening 244' of the bottom of the first layer which may tend to reduce the amount of curvature the structure will undergo. FIG. 22F depicts a side view of the state of the process after the structure is released from the sacrificial material and the release layer.

Figure 23:
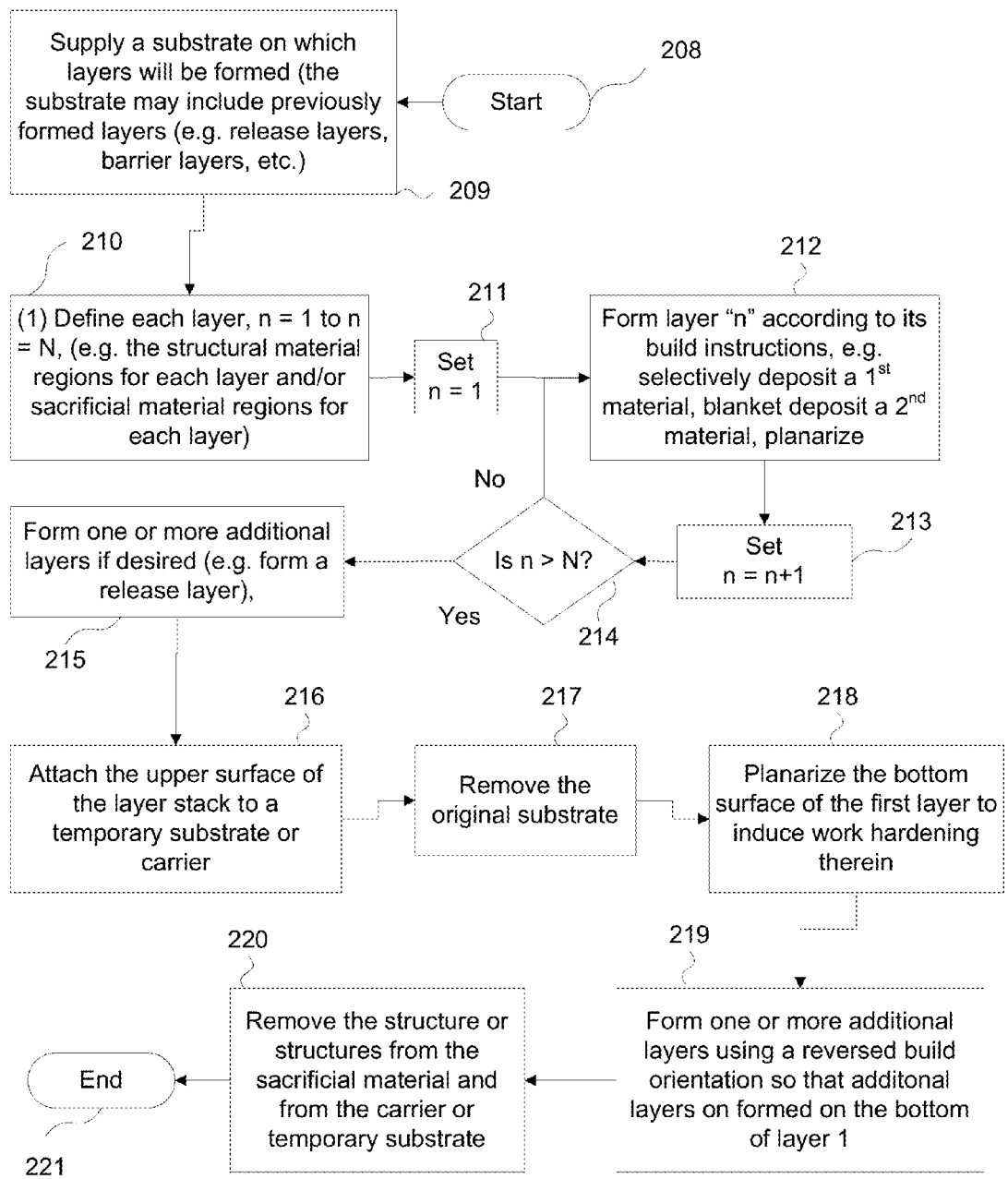
FIG. 23 provides a flowchart of an implementation of the third embodiment of the invention.

An example of the third embodiment of the invention may be implemented by inserting additional steps into the process of FIG. 19 as shown in block 219 of FIG. 23.

Figure 24A:
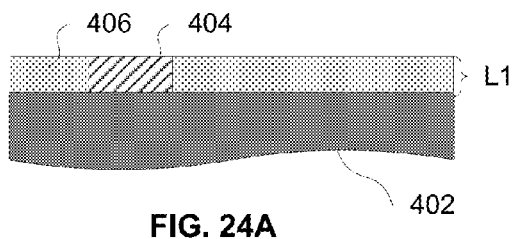
FIG. 24A-24H depict states of an example process as applied to a one layer cantilever structure implementing the fourth embodiment of the invention where the curvature reduction technique etches away the upper surface of the second layer and where the etching occurs in either a selective manner (FIG. 24F-1) based on the selectivity of an etchant used and not on masking (as would be the case in some other embodiments) or a non-selective manner (FIG. 24F-2) based on the non-selectivity of an etchant used and where the etched structural material is not replaced via a subsequent deposition process (as would be the case for some alternative embodiments).
Figure 24B:
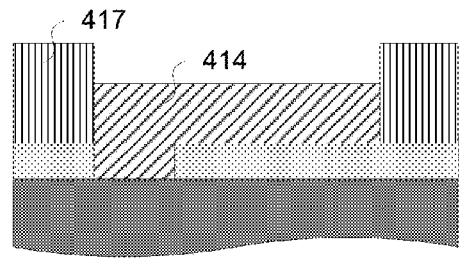
Figure 24C:
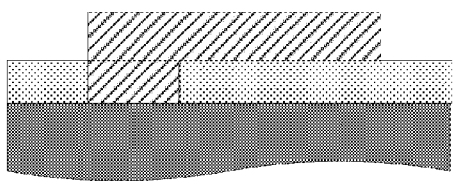
Figure 24D:
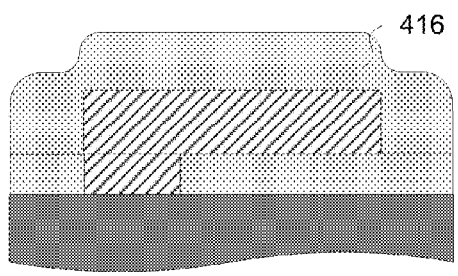
Figure 24E:
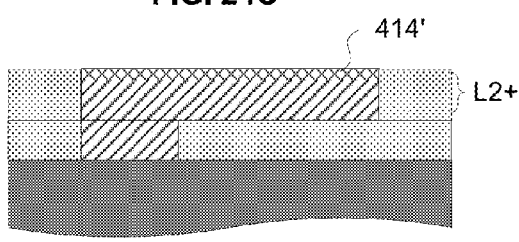
Figures 2, 24F:
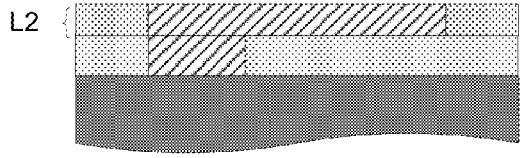
Figures 1, 24F:
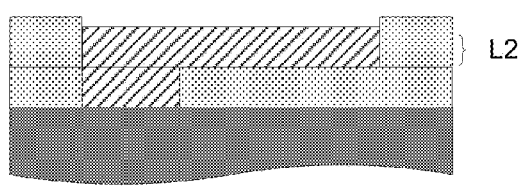

An Implementation of the Fourth Embodiment of the Invention and Some Alternatives FIG. 24A-24H depict states of an example process as applied to a one layer cantilever structure (the whole structure is formed with two layers) implementing the fourth embodiment of the invention where the curvature reduction technique etches away the upper surface of the second layer and where the etching occurs in either a selective manner (FIG. 24F1) based on the selectivity of an etchant used and not on masking (as would be the case in some other embodiments) or a non-selective manner FIG. 24F-2 based on the non-selectivity of and etchant used and where the etched structural material is not replaced via a subsequent deposition process (as would be the case for some alternative embodiments).

Figure 24G:
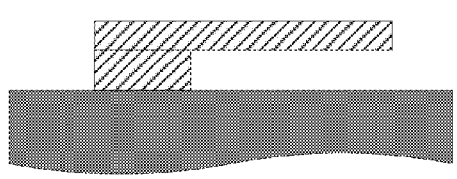
Figure 24H:
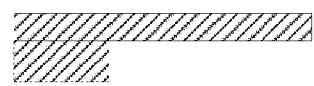

FIG. 24A depicts a side view of the state of the process after formation of a first layer L1, including structural material 404 and sacrificial material 406, on a substrate 402 where it is not indicated whether or not work hardening of the upper surface of the first layer has occurred. FIG. 24B depicts a side view of the state of the process after a mask 417 is formed and a second layer of structural material 412 is deposited. FIG. 24C depicts a side view of the state of the process after the mask is removed. FIG. 24D depicts a side view of the state of the process after blanket deposition of a sacrificial material 414 is deposited (in alternative embodiments the order of depositing the structural and sacrificial material may be reversed). FIG. 24E depicts a side view of the state of the process after the surface of the second layer L2 of deposited materials 414 and 416 is planarized at a level that is slightly above the desired level for the second layer (assuming that re-deposition of etched structural material will not occur). The upper surface 414' of the structural material 414 is shown as having been work hardened. FIG. 24F-1 depicts a side view of the state of the process after a selective etchant primarily attacks and removes the upper surface of the structural material (e.g. the portion of the structural material that has been work hardened as a result of the planarization process) to bring the level of the deposit to the boundary level of the layer whereas FIG. 24F-2 depicts the state of the process after a substantially non-selective etchant attacks and removes the upper surface of both the structural and sacrificial materials. FIG. 24G depicts the state of the process after the sacrificial material 416 and 406 have been removed and where FIG. 24H depicts the state of the process after separation of the structure from the substrate 402 (which may not occur in some alternative embodiments)

Figure 25A:
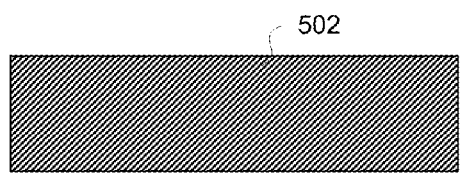
FIGS. 25A-25H depict states of an example process as applied to a one layer structure implementing the fifth embodiment of the invention where annealing of the upper surface structural material is used to eliminate or reduced stress and/or curvature distortion.
Figure 25B:
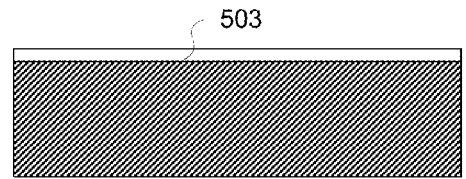
Figure 25C:
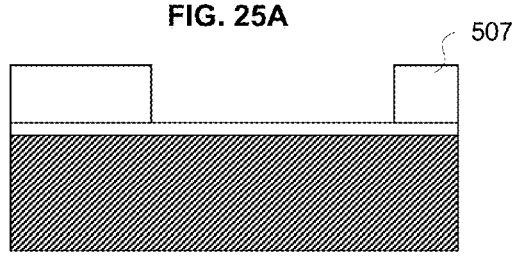
Figure 25D:
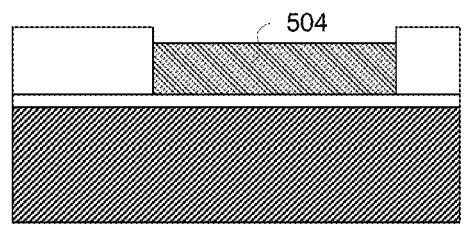
Figure 25E:
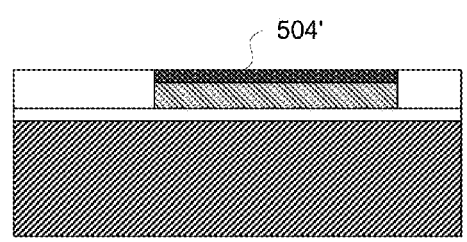
Figure 25F:
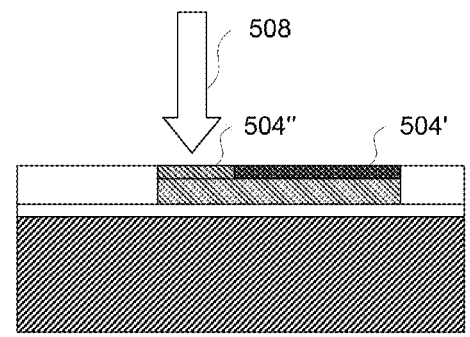
Figure 25G:
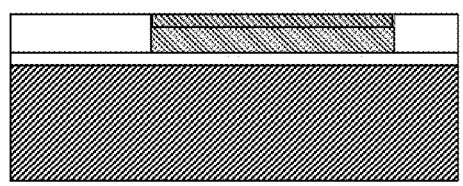
Figure 25H:

An Implementation of the Fifth Embodiment of the Invention and Some Alternatives FIGS. 25A-25H depict states of an example process as applied to a one layer structure implementing the fifth embodiment of the invention where annealing of the upper surface of the structural material is used to eliminate or reduced stress and/or curvature distortion. FIG. 25A depicts a side view of the state of the process after supplying a substrate 502 on which a layer or layers will be formed. FIG. 25B depicts a side view of the state of the process after a release layer 503 is formed on the substrate (such a release layer may not be necessary or appropriate in some embodiments). FIG. 25C depicts a side view of the state of the process after a patterned mask 507 is formed and adhered to the substrate (i.e. to the release layer on the substrate). In some alternative embodiments, the mask may be a photoresist mask which is adhered, exposed, and developed to yield desired openings. FIG. 25D depicts a side view of the state of the process after a structural material 504 is deposited. FIG. 25E depicts a side view of the state of the process after the surface of the masking material and structural material are planarized (in an alternative embodiments the masking material may have been removed and a sacrificial material deposited prior to planarization occurring) wherein the upper surface 504' of the structural material is shown as having been work hardened. FIG. 25F depicts a side view of the state of the process after a portion 504" of the upper surface of the first layer L1 has been annealed by beam 508 of a laser (not shown). FIG. 25G depicts a side view of the state of the process after the entire upper surface of the structural material has annealed to yield 504". FIG. 25H depicts the state of the process after the mask and substrate have been separated from the structural material 504/504" to yield structure 500.

As with the other embodiments, presented herein, the sixth embodiment may be implemented in a number of different ways. The heating that induces annealing may (1) expose the entire upper surface of the layer, (2) a mask may be formed on the upper surface of the layer to shield portions of the layer, (3) be supplied via an array of sources with only selected sources powered. Various other alternatives are also possible and will be understood by those of skill in the art.

Figure 26A:
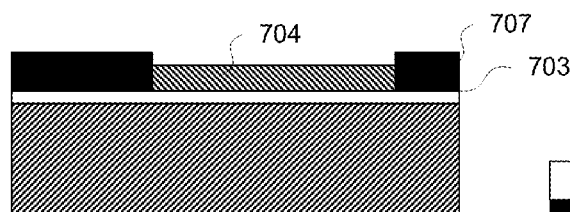
FIGS. 26A-26F depict states of an example process as applied to either a one layer structure that is divided into two layers or a two layer structure implementing the seventh embodiment of the invention where the upper sublayer or the second layer has its structural configuration modified to reduce stress and/or curvature distortion by inserting vertical stress relief into it (in alternative embodiments the breaks may be implemented so that they only extend into the layer to a depth necessary to extend through or nearly through any work hardened upper surface portion of the layer).
Figure 26B:
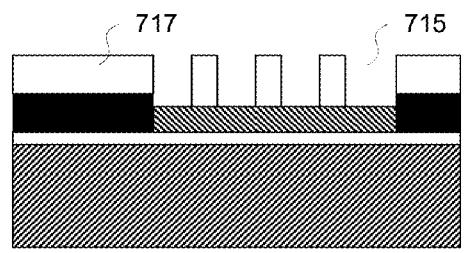
Figure 26C:
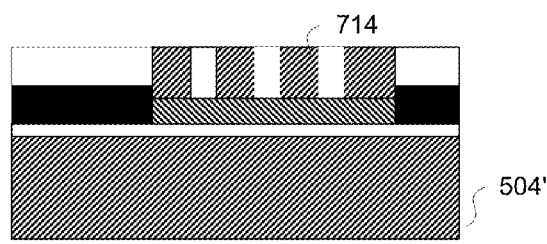
Figure 26D:
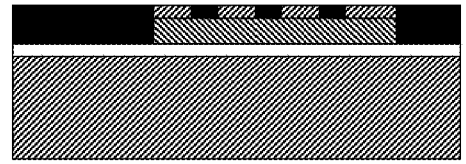
Figure 26E:
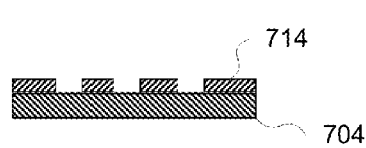
Figure 26F:

An Implementation of the Seventh Embodiment of the Invention and Some Alternatives FIGS. 26A-26F depict states of an example process as applied to either a one layer structure that is divided into two layers or a two layer structure implementing an example of the seventh embodiment of the invention where the upper sublayer or the second layer has its structural configuration modified to reduce stress and/or curvature distortion by inserting vertical stress reliefs into it (in alternative embodiments the breaks may be implemented so that they only extend into the layer to a depth necessary to extend through or nearly through any work hardened upper surface portion of the layer). FIG. 26A depicts a side view of the state of the process after supplying a substrate 702 on which a layer or layers of a structure will be formed, after a release layer 703 is formed on the substrate (such a release layer may not be necessary or appropriate in some embodiments), after a patterned mask 707 is formed and adhered to the substrate (i.e. to the release layer on the substrate), and after a structural material 704 is deposited to form a first layer or first sublayer of the first layer. FIG. 26B depicts a side view of the state of the process after a second layer or second sublayer of masking material 717 is applied to the surface of the first layer or first sublayer and patterned to form breaks 715 at periodic intervals along region that would be occupied by structural material if it were not for the stress and/or curvature that the process is attempting to minimize. FIG. 26C depicts a side view of the state of the process after plating of structural material 714 (e.g. nickel or a nickel alloy) into the openings in the mask 717. FIG. 26D depicts a side view of the state of the process after planarization of the upper surface of the second layer or second sublayer is performed to set the height of the second layer or second sublayer at the boundary level for that layer or sublayer. FIG. 26E depicts a side view of the state of the process after the mask and substrate have been separated from the structural material while FIG. 26F depicts a top view of the same state of the process (in this example it is noted that the notches formed in the upper surface extend in a single direction perpendicular to the length of the structure so as to maximize the stress relief that has occurred while in other embodiments other patterns of notches may be used and in still other embodiments, the notches may be filled with a material, e.g. by spreading, wiping clean, and solidifying.

An Implementation of the Eight Embodiment of the Invention and Some Alternatives FIGS. 27A-27H depict states of an example process as applied to a one layer cantilever structure 700 (the whole structure is formed with two layers) implementing the eighth embodiment of the invention where stress induced in worked hardened regions is isolated by the formation of breaks in the worked hardened material after it is formed to eliminate or reduced stress and/or curvature distortion. The breaks that are formed in the upper surface of the second layer of this example, may be designed into the structure or may be placed in the structure by implementation of an algorithm that modifies the structure based on a pre-designed pattern or based on a pattern that is created in response to design parameters specified by the builder in order optimize stress and/or curvature reduction.

Figure 27A:
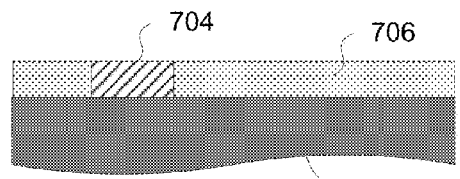
FIGS. 27A-27H depict states of an example process as applied to a one layer cantilever structure 700 (the whole structure is formed with two layers) implementing the eighth embodiment of the invention where stress induced in worked hardened regions is isolated by the formation of breaks in the worked hardened material after it is formed to eliminate or reduced stress and/or curvature distortion.
Figure 27B:
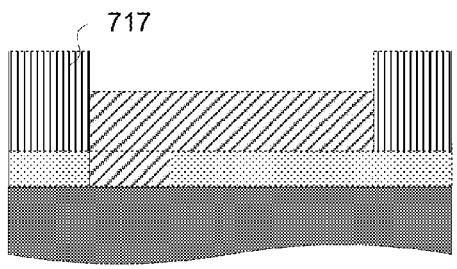
Figure 27C:
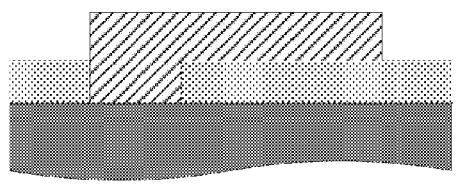
Figure 27D:
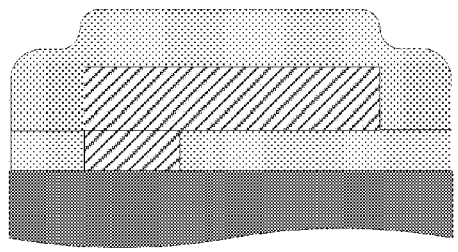
Figure 27E:
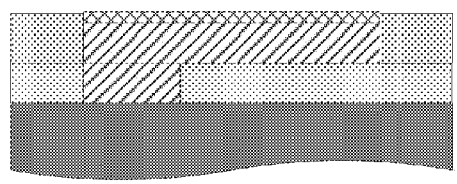
Figure 27F:
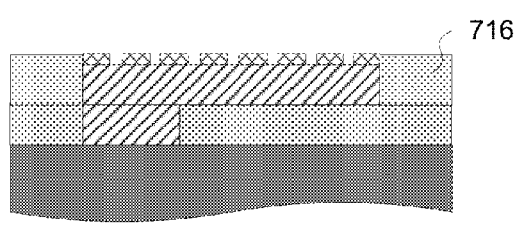
Figure 27G:
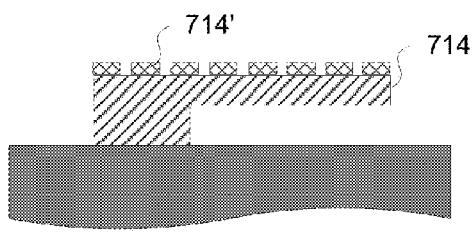
Figure 27H:
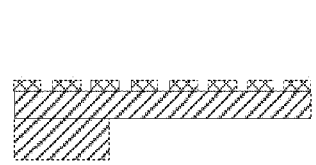

FIG. 27A depicts a side view of the state of the process after formation of a first layer L1, including structural material 704 and sacrificial material 706, on a substrate 702 where it is not indicated whether or not work hardening of the upper surface of the first layer has occurred (it is irrelevant to this example as if is intended to only deal with work hardening that has occurred on the second layer. FIG. 27B depicts a side view of the state of the process after a mask 717 is formed and a second layer of structural material 714 is deposited. FIG. 27C depicts a side view of the state of the process after the mask is removed. FIG. 27D depicts a side view of the state of the process after blanket deposition of a sacrificial material 716 is deposited (in alternative embodiments the order of depositing the structural and sacrificial material may be reversed). FIG. 27E depicts a side view of the state of the process after the surface of the second layer L2 of deposited materials 714 and 716 is planarized at a level that is slightly above the desired level for the second layer (assuming that re-deposition of etched structural material will not occur). The upper surface 714' of the structural material 714 is shown as having been work hardened. FIG. 27F depicts a side view of the state of the process after selectively removal of at least a desired depth of work hardened material has been removed, for example via patterned etching (dry or wet), partial depth dicing, laser ablation, or the like, FIGS. 27G and 27H depict the state of the process after removal of the sacrificial material and substrate respectively to yield the structure 700.

As with the other embodiments, presented herein, this embodiment may be implemented in a number of different ways including use of the CRP on a plurality of layers (instead of just the one illustrate). The stress relief gaps may filled in with a material that does not reintroduce stress, reintroduces less stress or even introduces stress that is opposite to that induced by the work hardening.

An Implementation of the Ninth Embodiment of the Invention and Some Alternatives FIGS. 28A-28G-2 depict the state of an example process as applied to a single layer cantilever structure, which is formed along with a post, where the layer of the cantilever structure is divided into two sublayers implementing the an example of the ninth embodiment where the structural portion of the layers is formed from two vertically stacked materials where planarization of the upper structural material occurs and where the upper material is planarizable by a non-stress inducing process (e.g. diamond fly cutting).

Figure 28A:
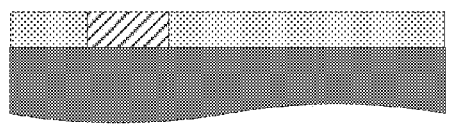
FIGS. 28A-28H depict state of an example process as applied to a single layer cantilever structure which is divided into two sublayers implementing the an example of the ninth embodiment where the structural portion of the layers is formed from two vertically stacked materials where planarization of the upper structural material occurs and where the upper material is planarizable by a non-stress inducing process (e.g. diamond fly cutting).
Figure 28B:
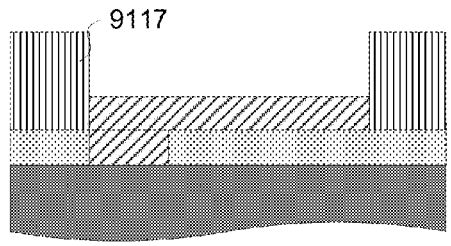
Figure 28C:
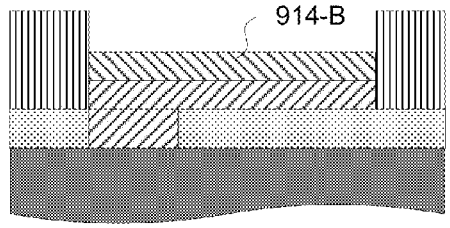
Figure 28D:
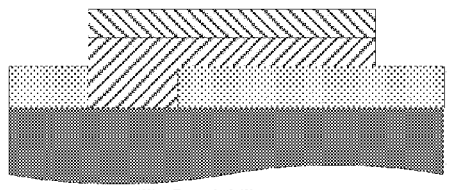
Figure 28E:
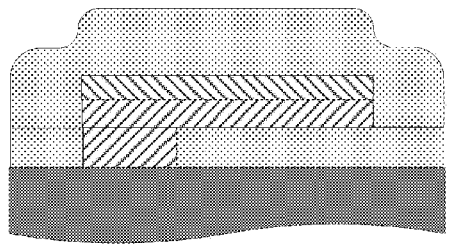
Figure 28F:
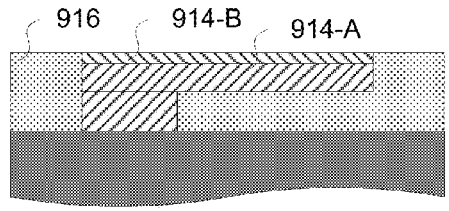
Figure 28G:
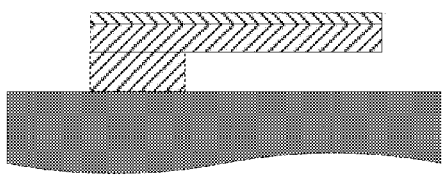
Figure 28H:
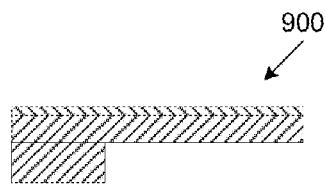

FIG. 28A depicts a side view of the state of the process after formation of a first layer L1 where it is not indicated whether or not work hardening of the upper surface of the first layer has occurred as it is not relevant to the present example as the CRP is only to be implement in conjunction with formation of the second layer. FIG. 28B depicts a side view of the state of the process after a mask 917 is formed and a first portion (e.g. sublayer of the second layer) of a first structural material 914-A is deposited, where the first structural material 914-A is a material that cannot be readily planarized (e.g. nickel, or nickel cobalt, rhodium, or the like) without inducing significant stress into it. FIG. 28C depicts a side view of the state of the process after a second structural material 914-B is deposited over the first structural material, wherein the second structural material is a material (e.g. amorphous nickel phosphorous) that can be readily planarized without inducing significant stress (e.g. by diamond fly cutting). FIG. 28D depicts a side view of the state of the process after the mask is removed. FIG. 28E depicts a side view of the state of the process after blanket deposition of a sacrificial material 716 has occurred (in alternative embodiments the order of depositing the structural and sacrificial material may be reversed). FIG. 28F depicts a side view of the state of the process after the surface of the second structural material 914-B is planarized at a level that corresponds to the boundary of the layer using a non-stress inducing planarization process. FIG. 28G depicts the state of the process after the sacrificial material has been removed and where FIG. 28H depicts the state of the process after separation of the structure 900 from the substrate (which may not occur in some alternative embodiments).

As with the other embodiments, presented herein, this embodiment may be implemented in a number of different ways including use of the CRP on a plurality of layers (instead of just the one illustrated). In some embodiments it may be acceptable if some portion of the material 914-A reaches the planarization level so long as it doesn't represent a large area that could negatively impact the effectiveness of the planarization process.

An Implementation of the Tenth Embodiment of the Invention and Some Alternatives FIGS. 29A-29H depict the states of an example process as applied to a single layer cantilever structure which is divided into two sublayers implementing an example of the tenth primary embodiment of the invention where the structural portion of the layer is formed from two vertically stacked materials where planarization of the upper structural material occurs and where the lower material is deposited in a low stress state while the upper material is deposited in a higher tensile stress state and where the upper material is planarized using a process (e.g. lapping) that introduces compression into the material such that the tensile and compressive forces at least partially cancel one another so that stress and/or distortion is reduced.

Figure 29A:
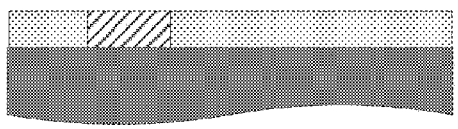
FIGS. 29A-29H depict state of an example process as applied to a single layer cantilever structure which is divided into two sublayers implementing an example of the tenth primary embodiment of the invention where the structural portion of the layer is formed from two vertically stacked materials where planarization of the upper structural material occurs and where the lower material is deposited in a low stress state while the upper material is deposited in a higher tensile stress state and where the upper material is planarized using a process (e.g. lapping) that introduces compression into the material such that the tensile and compressive forces at least partially cancel one another so that stress and/or distortion is reduced.
Figure 29B:
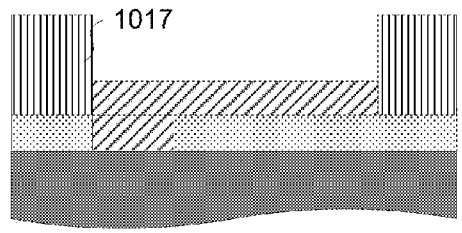
Figure 29C:
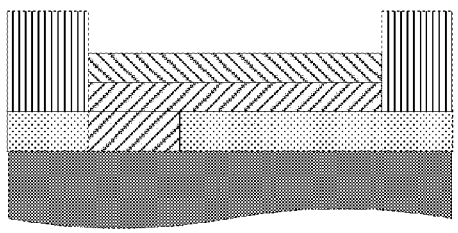
Figure 29D:
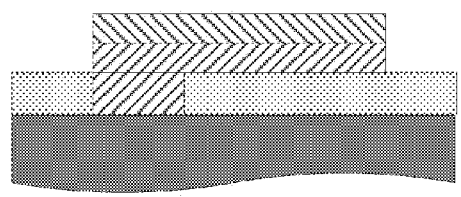
Figure 29E:
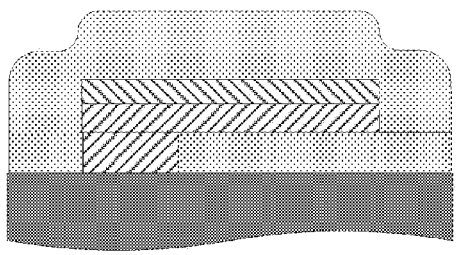
Figure 29F:
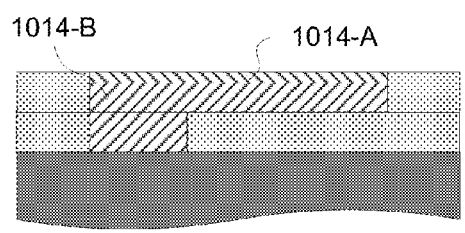
Figure 29G:
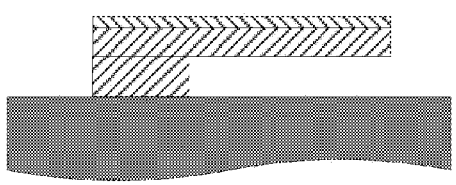
Figure 29H:
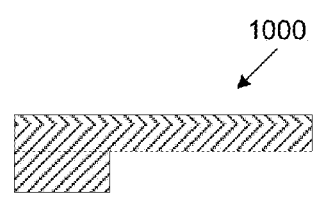

FIG. 29A depicts a side view of the state of the process after formation of a first layer that includes structural material 1004 and sacrificial material 1006 which have been deposited on substrate 1002 and then planarized. In this figure it is not indicated whether or not work hardening of the upper surface of the first layer has occurred as it is irrelevant to the present example as CRP is only intended to be applied to the second layer. FIG. 29B depicts a side view of the state of the process after a mask is formed and a first structural material 1014-A (e.g. first sublayer of the second layer) is deposited, where the first structural material 1014-A is a material that is preferably deposited with minimal tensile or compressive stress. FIG. 29C depicts a side view of the state of the process after a second structural material 1014-B is deposited over the first structural material, wherein the second structural material is deposited with significant tensile stress. FIG. 29D depicts a side view of the state of the process after the mask is removed. FIG. 29E depicts a side view of the state of the process after blanket deposition of a sacrificial material 1016 occurs. In some alternative embodiments the order of depositing the structural and sacrificial material may be reversed. FIG. 29F depicts a side view of the state of the process after the surface of the second structural material 1014-B is planarized at a level that corresponds to the boundary of the layer. Planarization includes use of process that induces compressive stress into the second material, wherein after planarization substantially all of or at least most of the remaining second material undergoes work hardening (which tends to induce compressive stress). FIG. 29G depicts the state of the process after the sacrificial material has been removed and where FIG. 29H depicts the state of the process after separation of the structure 1000 from the substrate. Separation from the substrate may not occur in some alternative embodiments.

As with the other embodiments, presented herein, this embodiment may be implemented in a number of different ways including use of the CRP on a plurality of layers (instead of just the one illustrated).

An Implementation of the Eleventh Embodiment of the Invention and Some Alternatives FIGS. 30A-30H depict state of an example process as applied to a single layer cantilever structure which is formed on a post and which is divided into two sublayers implementing an example of the eleventh primary embodiment of the invention where the structural portion of the layer is formed from two vertically stacked materials where planarization of the lower structural material occurs and sets the planned height of the deposited material at some distance below the desired layer thickness and where the planarization introduces work hardening into the upper surface of the first structural material and thereafter a thin coating of second structural material is deposited to raise the height of the deposited materials to the desired layer level and wherein the second material is chosen or deposited in such a way that it results in a high tensile stress deposit that helps compensate for the compressive stress in the work hardened region of the first material.

Figure 30A:
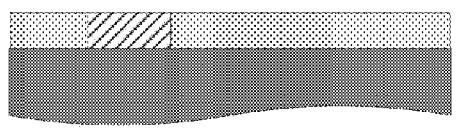
FIGS. 30A-30H depict state of an example process as applied to a single layer cantilever structure which is divided into two sublayers implementing an example of the eleventh primary embodiment of the invention where the structural portion of the layer is formed from two vertically stacked materials where planarization of the lower structural material occurs and sets the planed height of the deposited material at some distance below the desired layer thickness and where the planarization introduces work hardening into the upper surface of the first structural material and thereafter a thin coating of second structural material is deposited to raise the height of the deposited materials to the desired layer level and wherein the second material is chosen or deposited in such a way that it results in a high tensile stress deposit that helps compensate for the compress stress in the work hardened region of the first material.
Figure 30B:
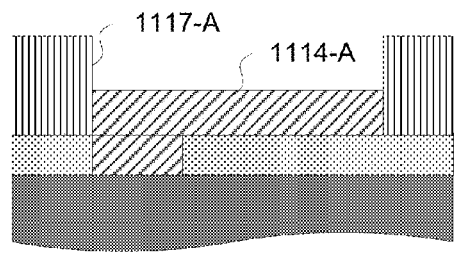
Figure 30C:
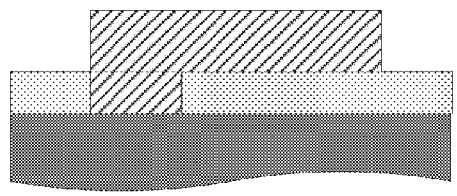
Figure 30D:
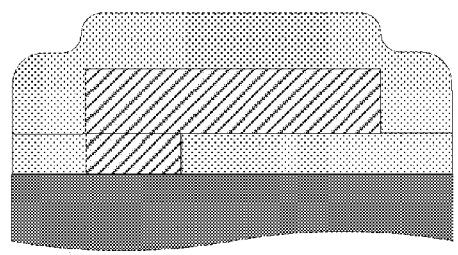
Figure 30E:
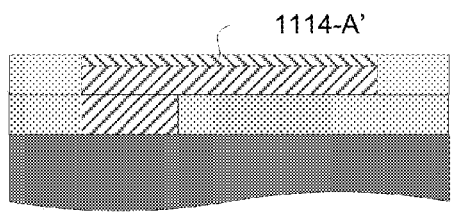
Figure 30F:
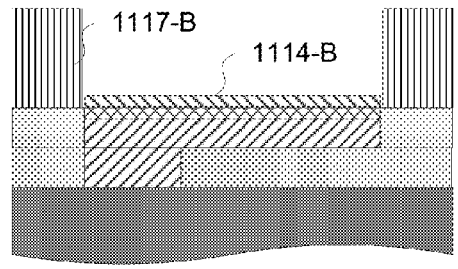
Figure 30G:
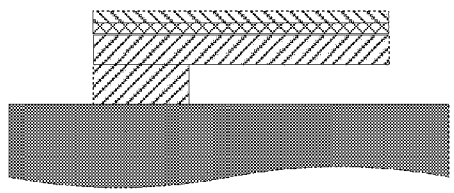
Figure 30H:
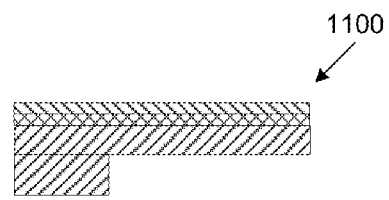

FIG. 30A depicts a side view of the state of the process after formation of a first layer that includes structural material 1104 and sacrificial material 1106 which were deposited onto substrate 1102 where it is not indicated whether or not work hardening of the upper surface of the first layer has occurred as it is irrelevant to the present example as the CRP is only to be applied to the second layer. FIG. 30B depicts a side view of the state of the process after a mask 1117-A is formed and a first structural material 1114-A (e.g. first sublayer of the second layer) is deposited, where the first structural material is a material that is preferably deposited with minimal tensile or compressive stress. FIG. 30C depicts a side view of the state of the process after the mask is removed. FIG. 30D depicts a side view of the state of the process after blanket deposition of a sacrificial material 1116 occurs (in alternative embodiments the order of depositing the structural and sacrificial material may be reversed). FIG. 30E depicts a side view of the state of the process after the surface of the first structural material 1114-A is planarized at a level that is somewhat below the desired boundary level of the layer using a planarization process that induces compressive stress into the first structural material, wherein planarization induces work hardening in only a portion 1114-A' of the thickness of the deposit of the first structural material. FIG. 30F depicts a side view of the state of the process after mask 1117-B is applied and a thin, high tensile stress coating of a second structural material 1114-B is deposited over work hardened portion 1114-A' of the first structural material. The amount of material 1114-B that is deposited is thin and it is believed it can be deposited with a sufficient uniform texture so as to no require further planarization. The second material 1114-B either inherently has a high tensile stress or is deposited in such away so as to incur a high tensile stress. It is believed that such stressing can help to compensate for the compressive stress induced in the upper portion 1114-A' of the first structural material such that stress and/or curvature distortion is reduced. FIG. 30G depicts the state of the process after the sacrificial material has been removed and FIG. 30H depicts the state of the process after separation of the structure 1100 from the substrate (which may not occur in some alternative embodiments). As with the other embodiments, presented herein, this embodiment may be implemented in a number of different ways including use of the CRP on a plurality of layers (instead of just the one illustrated).

Further Alternatives and Conclusions:

The various embodiments explicitly set forth in this application may take on a variety of alternative forms. For example, the orders of depositing structural and sacrificial material may be varied, different numbers of sacrificial and structural materials may be used, different mechanical, chemical, and electrochemical etching and planarization processes may be used. Depositions may be made using electrochemical techniques, electroless deposition techniques, sputtering, spraying, or spreading, as well as via other processes. Electrochemical deposition may take the form of electroplating of fixed current density, pulsed electroplating, reverse pulse plating.

Curvature reduction processes may involve or additionally include techniques to change grain structure within layers, such as for example, reverse pulse plating, formation of grain nucleation sites within a layer. Curvature reduction processes may involve theoretical or empirically determined process parameters that are optimized for a given situation. Though a portion of this application has been written based on the assumption that work hardening occurs near the surface of some materials (e.g. nickel, nickel-cobalt, other nickel alloys, and the like) when subjected to some planarization processes (e.g. lapping), the effectiveness of any stress reduction process or curvature reduction process should dictate the appropriateness of the process and not whether the assumed work hardening theory is determined to be accurate, inaccurate, or simply incomplete.

The curvature reduction techniques may be implemented on a critical or selected region basis, critical of selected layer basis, based on locations or layers containing up-facing regions, locations or layers containing non-up-facing regions, regions that are thin relative to a predefined value, regions have length to thickness aspect ratio that meet or do not meet certain criteria. Rework of layers that are determined to be, or are suspected of being faulty may be performed.

It will be understood by those of skill in the art or will be readily ascertainable by them that various additional operations may be added to the processes set forth herein. For example, between performances of the various deposition operations, the various etching operations, and the various planarization operations cleaning operations, activation operations, and the like may be desirable.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al. which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

Further teachings about planarizing layers and setting layers thicknesses and the like are set forth in the following US patent applications which were filed Dec. 31, 2003: (1) U.S. Patent Application No. 60/534,159 by Cohen et al. and which is entitled "Electrochemical Fabrication Methods for Producing Multilayer Structures Including the use of Diamond Machining in the Planarization of Deposits of Material" and (2) U.S. Patent Application No. 60/534,183 by Cohen et al. and which is entitled "Method and Apparatus for Maintaining Parallelism of Layers and/or Achieving Desired Thicknesses of Layers During the Electrochemical Fabrication of Structures". The techniques disclosed explicitly herein may benefit by combining them with the techniques disclosed in U.S. patent application Ser. No. 11/029,220, filed Jan. 3, 2005 by Frodis, et al., and which is entitled "Method and Apparatus for Maintaining Parallelism of Layers and/or Achieving Desired Thicknesses of Layers During the Electrochemical Fabrication of Structures". These patent filings are each hereby incorporated herein by reference as if set forth in full herein.

Additional teachings concerning the formation of structures on dielectric substrates and/or the formation of structures that incorporate dielectric materials into the formation process and possibility into the final structures as formed are set forth in a number of patent applications: (1) U.S. Patent Application No. 60/534,184, by Cohen, which as filed on Dec. 31, 2003, and which is entitled "Electrochemical Fabrication Methods Incorporating Dielectric Materials and/or Using Dielectric Substrates"; (2) U.S. Patent Application No. 60/533,932, by Cohen, which was filed on Dec. 31, 2003, and which is entitled "Electrochemical Fabrication Methods Using Dielectric Substrates"; (3) U.S. Patent Application No. 60/534,157, by Lockard et al., which was filed on Dec. 31, 2004, and which is entitled "Electrochemical Fabrication Methods Incorporating Dielectric Materials"; (4) U.S. Patent Application No. 60/574,733, by Lockard et al., which was filed on May 26, 2004, and which is entitled "Methods for Electrochemically Fabricating Structures Using Adhered Masks, Incorporating Dielectric Sheets, and/or Seed Layers that are Partially Removed Via Planarization"; and U.S. Patent Application No. 60/533,895, by Lembrikov et al., which was filed on Dec. 31, 2003, and which is entitled "Electrochemical Fabrication Method for Producing Multi-layer Three-Dimensional Structures on a Porous Dielectric". The techniques disclosed explicitly herein may benefit by combining them with the techniques disclosed in U.S. patent application Ser. No. 11/029,216 filed Jan. 3, 2005 by Cohen et al. and entitled "Electrochemical Fabrication Methods Incorporating Dielectric Materials and/or Using Dielectric Substrates". These patent filings are each hereby incorporated herein by reference as if set forth in full herein.

Some embodiments may not use any blanket deposition process. Some embodiments may involve the selective deposition of a plurality of different materials on a single layer or on different layers. Some embodiments may use blanket or selective depositions processes that are not electrodeposition processes. Some embodiments may form structures from two or more materials where one or more of the materials are coated with thin deposits of dielectric material and one or more materials are treated as a sacrificial material and removed after the formation of a plurality of layers. Some embodiments may use nickel or a nickel alloy as a structural material while other embodiments may use different materials such as gold, silver, or any other electrodepositable or electroless depositable materials. Some embodiments may use copper as the structural material with or without a sacrificial material. Some embodiments may remove a sacrificial material while other embodiments may not.

Though various portions of this specification have been provided with headers, it is not intended that the headers be used to limit the application of teachings found in one portion of the specification from applying to other portions of the specification. For example, it should be understood that alternatives acknowledged in association with one embodiment, are intended to apply to all embodiments to the extent that the features of the different embodiments make such application functional and do not otherwise contradict or remove all benefits of the adopted embodiment. Various other embodiments of the present invention exist. Some of these embodiments may be based on a combination of the teachings herein with various teachings incorporated herein by reference.

As noted above, embodiments of the invention may take a variety of forms some of which have been set forth herein in detail while others are described or summarized in a more cursory manner, while still others will be apparent to those of skill in the art upon review of the teachings herein though they are not explicitly set forth herein. Further embodiments may be formed from a combination of the various teachings explicitly set forth in the body of this application. Even further embodiments may be formed by combining the teachings set forth explicitly herein with teachings set forth in the various applications and patents referenced herein, each of which is incorporated herein by reference. In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. In a method of forming a multi-layer three-dimensional structure, comprising: (A) forming a plurality of successive layers of the structure with each successive layer adhered to a previously formed layer and with each successive layer comprising at least two materials, one of which is a structural material and the other of which is a sacrificial material, and wherein each successive layer defines a successive cross-section of the three-dimensional structure, and wherein the forming of each of the plurality of successive layers comprises: (i) depositing a first of the at least two materials; (ii) depositing a second of the at least two materials; and (B) after the forming of the plurality of successive layers, separating at least a portion of the sacrificial material from the structural material to reveal the three-dimensional structure, wherein the improvement comprises:

in association with the formation of a given one of the successive layers, depositing a primary structural material in a lateral region of the given one of the successive layers to form at least a majority of the given one of the successive layers in the lateral region, and thereafter planarizing the primary structural material to form a surface of the given one of the successive layers, and thereafter sequentially exposing portions of the surface to selected laser radiation which results in less distortion of the lateral region after the separating than would exist in absence of the exposing.

2. The method of claim 1 wherein operations applied to the given one of the successive layers is applied to the formation of a plurality of the successive layers.

3. The method of claim 1 wherein the laser radiation provides annealing of the material that is exposed to the laser radiation.

4. The method of claim 3 wherein a depth of annealing is selected from the group consisting of (1) as great as a depth of work hardening, (2) less than a thickness of one layer, and (3) more than a thickness of one layer.

5. The method of claim 1 wherein the exposing is performed prior to separating the sacrificial material from the structural material.

6. The method of claim 1 wherein the exposing of portions of the surface does not expose all lateral portions of the structural material.

7. The method of claim 6 wherein the exposing of portions of the surface exposes those portions of the surface of the structural material having a structural thickness of less than 100 microns in the layer stacking direction.

8. The method of claim 1 wherein the exposing of portions of the surface exposes all portions of the surface of the structural material.

9. The method of claim 8 wherein the exposing of portions of the surface further exposes at least some lateral regions occupied by sacrificial material.

10. In a method of forming a multi-layer three-dimensional structure, comprising: (A) forming a plurality of successive layers of the structure with each successive layer adhered to a previously formed layer and with each successive layer comprising at least two materials, one of which is a structural material and the other of which is a sacrificial material, and wherein each successive layer defines a successive cross-section of the three-dimensional structure, and wherein the forming of each of the plurality of successive layers comprises: (i) depositing a first of the at least two materials; (ii) depositing a second of the at least two materials; and (B) after the forming of the plurality of successive layers, separating at least a portion of the sacrificial material from the structural material to reveal the three-dimensional structure, wherein the improvement comprises:

in association with the formation of at least one of the successive layers, depositing a primary structural material in a lateral region of the layer to form at least a majority of the one successive layer in the lateral region, and thereafter planarizing the primary structural material to form a surface of the one successive layer, and thereafter applying heat to selected portions of the surface or to the surface as a whole which results in less distortion of the lateral region after the separating than would exist in absence of the heating.

11. The method of claim 10 wherein operations applied to the given one of the successive layers is applied to the formation of a plurality of the successive layers.

12. The method of claim 10 wherein the heating is supplied by laser radiation.

13. The method of claim 10 wherein the exposing is performed prior to separating the sacrificial material from the structural material.

14. The method of claim 10 wherein the selected portions are selected from the group consisting of: (1) selected structural material regions but less than all structural material regions, (2) all structural material regions, (3) selected structural and sacrificial material regions but less than all structural and sacrificial material regions, and (4) all structural and sacrificial material regions.

15. The method of claim 10 wherein the exposing of portions of the surface exposes those portions of the surface of the structural material having a structural thickness of less than 100 microns in the layer stacking direction.

* * * * *